United States Patent
Feldhaus et al.

(10) Patent No.: US 7,885,421 B2
(45) Date of Patent: Feb. 8, 2011

(54) METHOD AND SYSTEM FOR NOISE MEASUREMENT WITH COMBINABLE SUBROUTINES FOR THE MEASUREMENT, IDENTIFICATION AND REMOVAL OF SINUSOIDAL INTERFERENCE SIGNALS IN A NOISE SIGNAL

(75) Inventors: Gregor Feldhaus, Munich (DE); Hagen Eckert, Mering (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1424 days.

(21) Appl. No.: 11/333,793

(22) Filed: Jan. 17, 2006

(65) Prior Publication Data

US 2006/0195501 A1 Aug. 31, 2006

(30) Foreign Application Priority Data

Jan. 14, 2005 (DE) .................. 10 2005 001 932
Mar. 21, 2005 (DE) .................. 10 2005 012 977

(51) Int. Cl.
*H04B 15/00* (2006.01)
*G01R 13/00* (2006.01)
*G06F 17/10* (2006.01)

(52) U.S. Cl. .............. 381/94.2; 381/94.1; 381/94.3; 381/94.5; 381/94.7; 702/191; 702/195; 702/69; 702/70; 708/300; 708/309; 708/311

(58) Field of Classification Search ....... 381/94.1–94.9; 702/17, 69, 70, 190, 191, 195; 708/300, 708/309, 311, 400, 31

See application file for complete search history.

(56) References Cited

U.S. PATENT DOCUMENTS

| | | | |
|---|---|---|---|
| 4,456,959 A | 6/1984 | Hirano et al. | |
| 4,853,903 A * | 8/1989 | Linville et al. | ................ 367/46 |
| 4,982,150 A | 1/1991 | Silverstein et al. | |
| 5,400,265 A | 3/1995 | Kauppinen | |
| 2003/0125091 A1* | 7/2003 | Choi et al. | ................ 455/562 |
| 2006/0029142 A1* | 2/2006 | Arad | ................ 375/260 |

OTHER PUBLICATIONS

Hayes, H., "Statistical digital signal processing and modeling," John Wiley & Sone, 1996, pp. 451-469.
Translation of German Search Report for German Application No. 10 2005 012 977.3, dated Mar. 21, 2005, pp. 1-4 (previously cited Jan. 17, 2006).

* cited by examiner

*Primary Examiner*—Devona E Faulk
(74) *Attorney, Agent, or Firm*—Ditthavong Mori & Steiner, P.C.

(57) ABSTRACT

An approach is provided for measuring, identifying, and removing at least one sinusoidal interference signal ($A_k \cdot e^{j(\omega_k t + \phi_k)}$, $A_k \cdot e^{j(\mu \cdot \omega_k \Delta t + \phi_k)}$) in a noise signal (w(t), w(μ·Δt)). A frequency range to be measured is split into a plurality of frequency bands (v) via a Fast Fourier Transform (FFT) filter bank. For each of the frequency bands (v), an autocorrelation matrix ($\hat{R}_v$) is determined, wherein parameters of the autocorrelation matrices ($\hat{R}_v$) are variably adjusted based on whether the at least one sinusoidal interference signal ($A_k \cdot e^{j(\omega_k t + \phi_k)}$, $A_k \cdot e^{j(\mu \cdot \omega_k \Delta t + \phi_k)}$) is to be measured, identified, or removed and further based on at least one averaging. The autocorrelation matrices ($\hat{R}_v$) are jointly utilized for one or more of measuring, identifying, or removing the at least one sinusoidal interference signal ($A_k \cdot e^{j(\omega_k t + \phi_k)}$, $A_k \cdot e^{j(\mu \cdot \omega_k \Delta t + \phi_k)}$) in the noise signal (w(t), w(μ·Δt)).

10 Claims, 12 Drawing Sheets

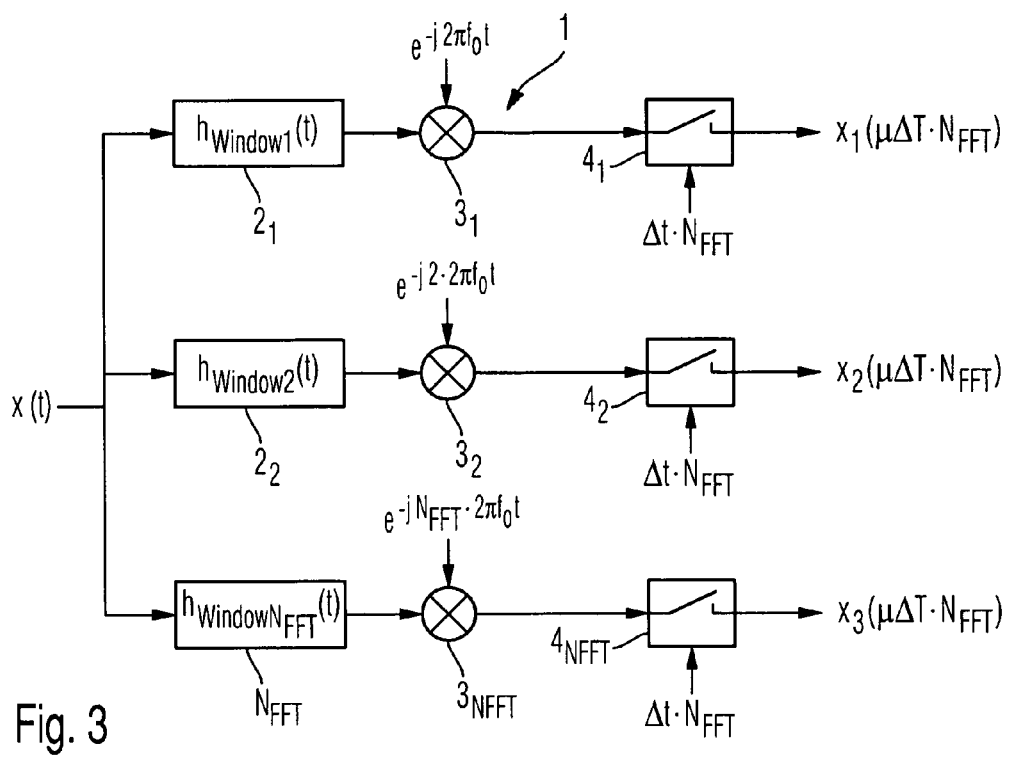
Fig. 3
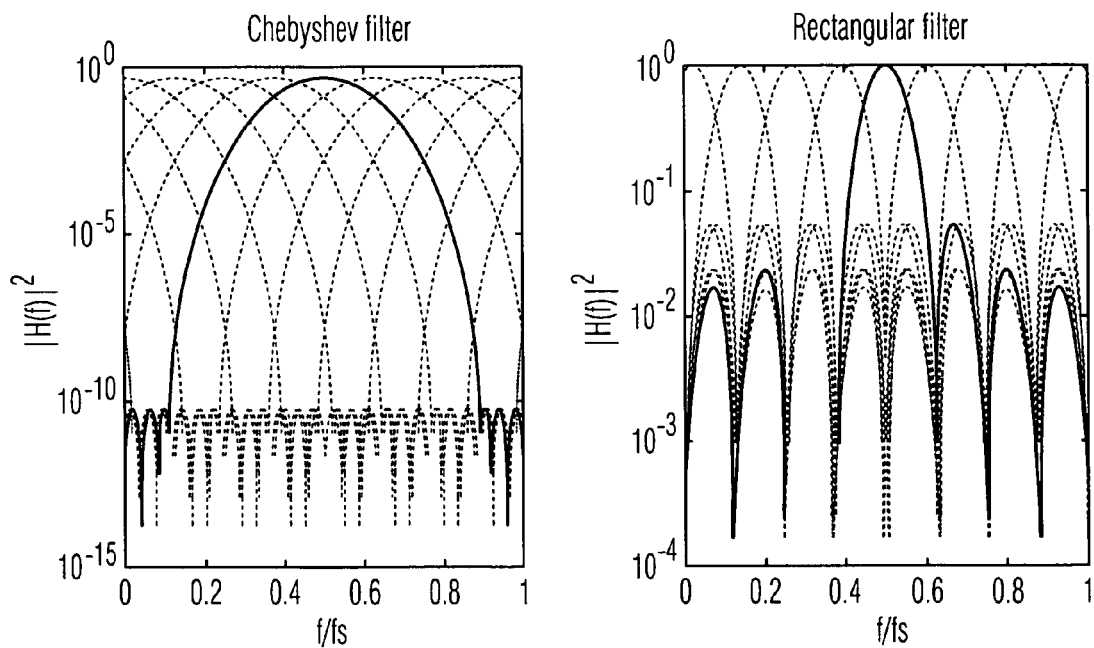
Fig. 4A
Fig. 4B

METHOD AND SYSTEM FOR NOISE MEASUREMENT WITH COMBINABLE SUBROUTINES FOR THE MEASUREMENT, IDENTIFICATION AND REMOVAL OF SINUSOIDAL INTERFERENCE SIGNALS IN A NOISE SIGNAL

RELATED APPLICATIONS

The present Application claims priority, under 35 U.S.C. §119(a)-(d), from German Patent Application No. 10 2005 001 932.3, filed Jan. 14, 2005, and German Patent Application No. 10 2005 012 977.3, Mar. 21, 2005, both of which are incorporated herein, by reference, in their entireties.

BACKGROUND (1) Field of Invention

The invention relates to a method and a system for noise measurement with combinable subroutines for the measurement, identification and removal of sinusoidal interference signals in a noise signal.

(2) Background Information

As illustrated in FIG. 1, measured noise signals conventionally comprise superimposed sinusoidal interference signals. The sources of these sinusoidal interference signals are to be found either internally within the device or externally. Some of the frequencies and interference lines are known in advance (network hum up to 10 harmonics, subsidiary lines of an internal frequency synthesiser, crosstalk from frequency dividers, microphone effects, for example, from fans) and some must still be determined.

These spectral lines associated with sinusoidal interference signals can be disturbing, for example, in the measurement of phase noise and must therefore be identified and removed as well as possible from the noise measuring curve. However, in some applications, it is also important just to measure the frequencies and power levels of the sinusoidal interference signals as accurately as possible or to compare them with known frequencies and power levels of sinusoidal, reference interference signals within the framework of a reference measurement.

In the context of a high-precision spectral analysis of a measured signal, it is therefore desirable to identify the individual spectral lines associated with the sinusoidal interference signals from the other spectral components of the measured signal, to measure the frequencies and power level of the identified spectral lines and, if required, for example, in the case of a noise measurement, to remove the identified spectral lines from the measured spectrum completely.

According to the prior art, graphic methods are used for the identification of sinusoidal interference signals in a noise signal.

In one graphic method, as shown in FIG. 2, a threshold-value line is placed over the noise curve. All of the components of the spectrum disposed above this threshold-value line are recognised as spectral lines. The left and right intersection of the peak lines identified respectively by the threshold-value line with the peak-free noise curve is determined and linked by means of an appropriate interpolation.

The identification of spectral lines associated with sinusoidal interference signals in a noise spectrum requires a high-resolution Fourier Transform. Spectral lines disposed close together cannot be identified separately from one another using graphic means. The use of a constant threshold-value line is not appropriate in the case of a phase-noise curve, which provides a monotonously descending course. Consequently, a threshold-value line must be used, which provides a course, which is constant only in very small regions, or a course which is complementary to the phase noise curve. In such a case, measuring the position of spectral lines is disadvantageously still only possible in a heuristic manner. A further disadvantage of the graphic method is the fact that, because of the interpolation of the noise curve, the precise information about the noise curve in the region of the identified spectral lines is lost. Furthermore, with numerous spectral lines in the noise curve, the graphic imprint of the spectrum curve is destroyed as a result of the numerous interpolations. Finally, the graphic method disadvantageously also does not allow a separation between the individual subroutines of measurement, identification, nor does it therefore allow a selection of one or more of these subroutines dependent upon the respective requirements of the measuring task.

DISCLOSURE

The invention is therefore based upon the object of providing a method and a system for the identification and/or removal of sinusoidal interference signals in a noise signal, which is based upon an efficient numerical method using a Fast Fourier Transform with a practicable frequency resolution and which allows a selection of one or more of the subroutines for noise measurement, identification and removal dependent upon the measurement task.

The object of the invention is achieved by a method with the subroutines, which can be combined in a system for noise measurement, for the measurement, identification and removal of sinusoidal interference signals in a noise signal according to claim 1, a system for noise measurement with the combinable subroutines for the measurement, identification and removal of sinusoidal interference signals in a noise signal according to claim 9. Advantageous further embodiments of the invention are specified in the respective dependent claims.

With the subroutine according to the invention for the identification of sinusoidal interference signals in a noise signal, the entire frequency range of the noise signal to be measured is subdivided via a Fast Fourier Transform filter bank into several frequency bands, in which the respective noise signal is approximately white and additionally contains only a limited, comparatively small number of spectral lines associated with sinusoidal interference signals.

Accordingly, the conditions are fulfilled for a determination of the frequencies and power levels of the sinusoidal interference signals, using a method for eigenvalue analysis of autocorrelation matrices, which are obtained from the measured signal comprising the noise signal and superimposed sinusoidal interference signals. In this context, the eigenvalues for the autocorrelation matrix obtained for each frequency band are analysed respectively into the eigenvalues associated with the noise components and the eigenvalues associated with the signal components. The eigenvalues associated with the noise components are the respectively lowest eigenvalues and provide a significant value-difference relative to the eigenvalues associated with the signal components. Using the eigenvectors associated with the noise eigenvalues, an estimation function is formed, of which the maxima represent the power levels for the sought sinusoidal interference signals associated with the respective frequencies.

By way of example, the estimation function based upon the MUSIC (Multiple Signal Classification) method can be used as the estimation function. However, other frequency-estimation methods based upon the analysis of eigenvalues of autocorrelation matrices can also be used as an alternative.

A Fast Fourier Transform filter bank is used to generate frequency bands with a frequency bandwidth, in which the noise signal can be assumed to be white.

On the basis of the windowing of the Fast Fourier Transform filter bank, which is realised, for example, via a Chebyshev filter, the spectral lines of sinusoidal interference signals appear not only in one frequency band, but also in several adjacent frequency bands on the left and the right. These additional spectral lines are undesirable; they must be identified as such and must therefore be taken into consideration in the identification and removal of the spectral lines.

On the basis of the window function, the spectral lines of sinusoidal interference signals extend over several frequency bands. With a scaling according to the invention of the frequency difference of each of these spectral lines generated from the window function in the respective frequency band to the mid-frequency of the respective frequency band with the bin width of the respective FFT used, it is comparatively simple, by deconvolution according to the invention, to re-combine the power levels determined via the estimation function and associated with the individual interference spectral lines, which are distributed over several frequency bands.

If two or more sinusoidal interference signals have a frequency, which is disposed respectively in two or more adjacent frequency bands, and at the same time, have the same scaled frequency on the basis of their frequency position relative to the mid-frequency of the respective frequency band, and accordingly come to be disposed at the same frequencies over several adjacent frequency bands, the power levels of the spectral lines associated with the individual sinusoidal interference signals can be separated according to the invention by means of a deconvolution. As an important condition for the use of the Welch method associated with the prior art, the individual FFTs of the Fast Fourier Transform filter bank according to the invention are provided with a mutual time offset in the time domain.

With the subroutine according to the invention for the removal of sinusoidal interference signals from a noise signal, in exactly the same manner as in the subroutine for the identification of sinusoidal interference signals in a noise signal, the entire frequency range of the measured signal is divided into several frequency bands by means of a Fast Fourier Transform filter bank. The frequencies of the sinusoidal interference signals, which are determined either through the subroutine according to the invention for the identification of sinusoidal interference signals in a noise signal described above or which are specified by the user, are assigned to the individual frequency bands. In this context, it is also taken into consideration that, spectral lines from a sinusoidal interference signal occur not only in a single frequency band, but in several adjacent frequency bands as a result of the windowing of the FFT.

Starting from the number of spectral lines to be removed per frequency band, the noise power of the respective frequency band is determined according to the invention from a given number of lowest eigenvalues of an autocorrelation matrix associated with the respective frequency band. The number of lowest eigenvalues of the autocorrelation matrix associated with the respective frequency band, which are associated with the individual noise components of the measured signal comprising the noise signal and the sinusoidal interference signals, is determined, respectively via an analysis of all eigenvalues of the autocorrelation matrix associated with the respective frequency band, in that all of the eigenvalues associated with the respective noise components are minimal and provide a significant value difference relative to the signal components—the sinusoidal interference signals. With a specified number of interference-signal spectral lines to be removed, the number of eigenvalues associated with the noise signal can, according to the invention, also be determined from the matrix dimension minus the specified number of interference-signal spectral lines to be removed. The spectrum of the noise signal after the removal of the sinusoidal interference signals is derived according to the invention from the combination of all of the noise spectra associated with the individual frequency bands.

Since the two subroutines for the identification and removal of sinusoidal interference signals in a noise signal respectively contain the procedural stages of splitting the frequency range via an FFT filter bank into several frequency bands and determining the autocorrelation matrices associated with the respective frequency bands, and, as will be shown in greater detail below, the subroutine for noise measurement can also be realised via these two procedural stages, these two procedural stages according to the invention are implemented jointly for all three subroutines.

In this context, it must be taken into consideration that the matrix dimension of the autocorrelation matrices is of a different size for each of the three subroutines. Accordingly, in a first embodiment of the method and the system according to the invention for noise measurement with the combinable subroutines for the measurement, identification and removal of sinusoidal interference signals in a noise signal, the respective maximum matrix dimension is used for each of the autocorrelation matrices. In this embodiment, the computational cost does, in fact, represent a maximum, however, evaluation data are available for processing at all times for all three subroutines without interruption. In a second embodiment of the method and the system according to the invention, in the normal operating mode, the autocorrelation matrix is calculated with the minimum matrix dimension—the matrix dimension required for noise measurement at the level of the value 1—and, in the case of an implementation of the subroutine for identification or removal, the respective autocorrelation matrix is re-initialised with the matrix dimension required for the respective subroutine for identification or removal. Accordingly, in the case of the second embodiment, each subroutine is implemented at its respectively maximum rate; however, in the subroutine for identification or removal, it is not possible to access the evaluation data from before the time of initialisation, because of the re-initialisation of the autocorrelation matrix.

Alongside the parameter of the matrix dimension for the respective autocorrelation matrices, the parameter of the number of averagings can also be varied according to the invention within the framework of a re-initialisation of the autocorrelation matrices. In the case of a large noise variance of the measured signal, sinusoidal interference signals, which are difficult to identify, can advantageously be identified in the noise spectrum with less ambiguity and greater security through an additional averaging up to the present time.

BRIEF DESCRIPTION OF THE DRAWINGS

The two embodiments of the method and system according to the invention for noise measurement with the combinable subroutines for the measurement, identification and removal of sinusoidal interference signals in a noise signal are explained in greater detail below with reference to the drawings. The drawings are as follows:

FIG. 3 shows a block diagram of a Fast Fourier Transform filter bank;

FIGS. 4A, 4B show a frequency spectrum of a Chebyshev window and a rectangular window;

DESCRIPTION OF THE PREFERRED EMBODIMENT

Figure 1:
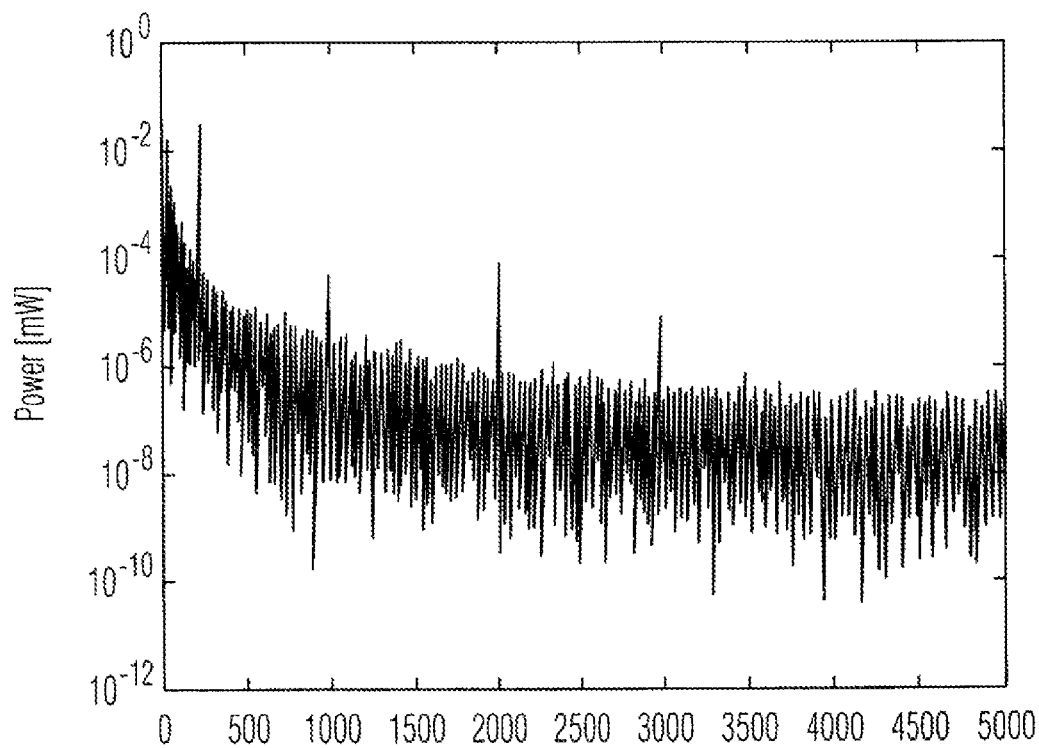
FIG. 1 shows a spectral display of a measured spectrum of a noise signal with superimposed interference-signal spectral lines.
Figure 2:
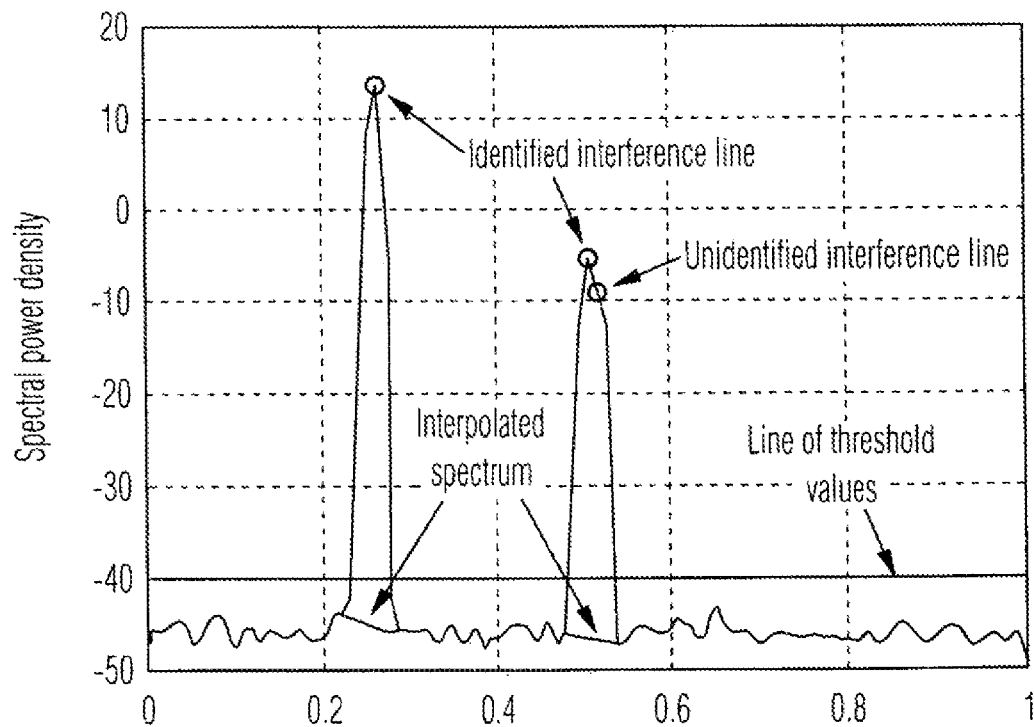
FIG. 2 shows a spectral display of a noise spectrum with the interference-signal spectral lines removed on the basis of graphic methods.

Before describing the subroutine according to the invention for the detection of sinusoidal interference signals in a noise signal, the subroutine according to the invention for the removal of sinusoidal interference signals from a noise signal and the method according to the invention for noise measurement with the combinable subroutines according to the invention for the measurement, identification and removal of sinusoidal interference signals in a noise signal in greater detail with reference to FIGS. 9, 10, 11, 12, 13, and 14, the following section presents the theoretical background, on which the invention is based.

According to the invention, the entire frequency range of the measured signal comprising the noise signal and sinusoidal interference signals is split into several frequency bands, in which the respective noise signal is approximately white and which each contain only a limited, comparatively small number of sinusoidal interference signals. The subdivision into several frequency bands takes place via a filter bank, which is realised in the form of a Fast Fourier Transform (FFT) according to FIG. 3.

An FFT filter bank 1, which, according to the invention, generates a number of frequency bands corresponding to its FFT length $N_{FFT}$, accordingly comprises a total of $N_{FFT}$ signal paths, which, from a measured signal x(t), leads to a total of $N_{FFT}$ time-discrete output signals $x_1(\mu \cdot \Delta t)$, $x_2(\mu \cdot \Delta t), \ldots, x_{N_{FFT}}(\mu \cdot \Delta t)$. With a real measured signal x(t) and therefore with a symmetrical spectrum X(f), only the FFT in one sideband needs to be evaluated. In this case, the number of frequency bands to be observed is reduced to $N_{FFT}/2$. The input signal x(t) is subjected in each of the $N_{FFT}$ signal paths first to a windowing $2_1, 2_2, \ldots, 2_{NFFT}$ with the respectively associated impulse response $h_{Window1}(t)$, $h_{Window2}(t), \ldots, h_{WindowNFFT}(t)$. The mid-frequencies of the respective window transmission function $H_{Window1}(f)$, $H_{Window2}(f), \ldots, H_{WindowNFFT}(f)$ agree with the frequencies $v \cdot f_0$ of the individual FFT bins and also form the main frequencies of the individual frequency bands v. The bandwidth of each of the window transmission functions $H_{Window1}(f)$, $H_{Window2}(f), \ldots, H_{WindowNFFT}(f)$ is therefore derived as follows—under the ideal condition of rectangular frequency spectra of the window transmission functions $H_{Window1}(f)$, $H_{Window2}(f), \ldots, H_{WindowNFFT}(f)$—from the bin width $f_0$ of the FFT and also corresponds to the bandwidth $\Delta f$ of each of the frequency bands.

After the windowing $2_1, 2_2, \ldots, 2_{NFFT}$, each windowed signal is mixed in subsequent down mixings $3_1, 3_2, \ldots, 3_{NFFT}$, with the frequency $f_0, 2 \cdot f_0, \ldots, N_{FFT} \cdot f_0$ into the respective frequency band in the baseband.

Finally, with the signals windowed and mixed down into the baseband, an undersampling $4_1, 4_2, \ldots, 4_{NFFT}$ takes place in the individual signal paths with the respective sampling rate $$\frac{1}{N_{FFT} \cdot \Delta t},$$

which leads to the individual time-discrete output signals $x_1(\mu \cdot \Delta t), x_2(\mu \cdot \Delta t), \ldots, x_{NFFT}(\mu \cdot \Delta t)$ at the respective outputs of the individual signal paths. Each of the time-discrete output signals $x_1(\mu \cdot \Delta t), x_2(\mu \cdot \Delta t), \ldots, x_{NFFT}(\mu \cdot \Delta t)$ is assigned to one of the total of $N_{FFT}$ frequency bands and each provides an approximately white noise signal and has a limited, comparatively small number of sinusoidal interference signals.

In reality, the window transmission functions $H_{Window1}(f)$, $H_{Window2}(f), \ldots, H_{WindowNFFT}(f)$ do not provide rectangular frequency spectra, but, with a Chebyshev filter as shown in FIG. 4A or with a rectangular filter as shown in FIG. 4B, provide several "subsidiary lobes" disposed to the left and right of a "main lobe". While a rectangular filter provides a narrow "main lobe" and therefore most nearly fulfils the requirement for the realisation of a high-frequency resolution corresponding to the bin width $f_0$ of the FFT, one spectral line disadvantageously continues periodically in the adjacent "subsidiary lobes" corresponding to the attenuation of the respective "subsidiary lobe" (so-called "leakage effect"). In the case of the Chebyshev filter, by contrast, the periodic continuation in the individual "subsidiary lobes" of spectral lines occurring in the "main lobe" can be reduced in a targeted manner to a negligible value by attenuating the "subsidiary lobes", while the bandwidth of the "main lobe" disadvantageously extends over several FFT bins and therefore over several frequency bands. The removal according to the invention of the disadvantageous influence of the window function over several frequency bands is explained in greater detail below.

The output signal $x(\mu \cdot \Delta t \cdot N_{FFT})$ in the $\nu$-$^{th}$ frequency band generated by the FFT filter bank is derived, in the case of a time-discrete input signal $x(\mu \cdot \Delta t)$, according to equation (1):

$$x(\mu \cdot \Delta t \cdot N_{FFT}) = \Delta t \cdot \sum_{\mu} x(\mu \Delta t) \cdot h(\mu \Delta t) \cdot e^{-j\frac{2\pi}{N_{FFT}}\nu\mu} \quad (1)$$

If the time-discrete input signal $x(\mu \cdot \Delta t)$ contains a sinusoidal interference signal with a frequency $f_k$, which is disposed exactly on the mid-frequency of the FFT bin ($f_k = \nu \cdot f_0$), then, with $x(\mu \Delta t) = e^{j2\pi \nu f_0 \mu \Delta t}$ and the relationship $$f_0 = \frac{1}{N_{FFT}\Delta t},$$

an output signal $x(\mu \cdot \Delta t \cdot N_{FFT})$ of the FFT filter bank is derived according to equation (2):

$$x(\mu \cdot \Delta t \cdot N_{FFT}) = \Delta t \cdot \sum_{\mu} e^{j2\pi \nu f_0 \mu \Delta t} \cdot h(\mu \Delta t) \cdot e^{-j\frac{2\pi}{N_{FFT}}\nu\mu} \quad (2)$$

$$= \Delta t \cdot \sum_{\mu} h(\mu \Delta t)$$

$$= const.$$

If the frequency $f_k$ of the sinusoidal interference signal is disposed centrally between two FFT bins $$\left(f_k = \nu f_0 \pm \frac{f_0}{2}\right),$$

then the output signal $x(\mu \cdot \Delta t \cdot N_{FFT})$ of the FFT filter bank in the $\nu$-$^{th}$ frequency band provides a rotating phasor with maximum rotational velocity $$\frac{f_0}{2}$$

according to equation (3)

$$x(\mu \cdot \Delta t \cdot N_{FFT}) = \Delta t \cdot \sum_{\mu} e^{j2\pi\left(\nu f_0 \pm \frac{f_0}{2}\right)\mu \Delta t} \cdot h(\mu \Delta t) \cdot e^{-j\frac{2\pi}{N_{FFT}}\nu\mu} \quad (3)$$

$$= \Delta t \cdot \sum_{\mu} h(\mu \Delta t) \cdot e^{\pm j2\pi \frac{f_0}{2}\Delta t}$$

As a result of the windowing, spectral lines of sinusoidal interference signals, of which the frequency $f_k$ comes to be disposed in a given frequency band, are also detected in adjacent frequency bands. The amplitude of these subsidiary spectral lines is derived from the attenuation of the window transmission function.

According to equation (4), the phases of the subsidiary spectral lines are constant, subject to the condition of a real and symmetrical (even) window function $h_{Window}(t)$ and therefore also of a real and even window transmission function $H_{Window}(f)$ relative to the phase of the main spectral line generated by the "main lobe" of the window transmission function:

$$\sphericalangle(A_k \cdot \delta(f-f_k) * H_{Window}(f)) = \sphericalangle(A_k \cdot H_{Window}(f-f_k)) = \sphericalangle A_k = const. \quad (4)$$

Figure 5:
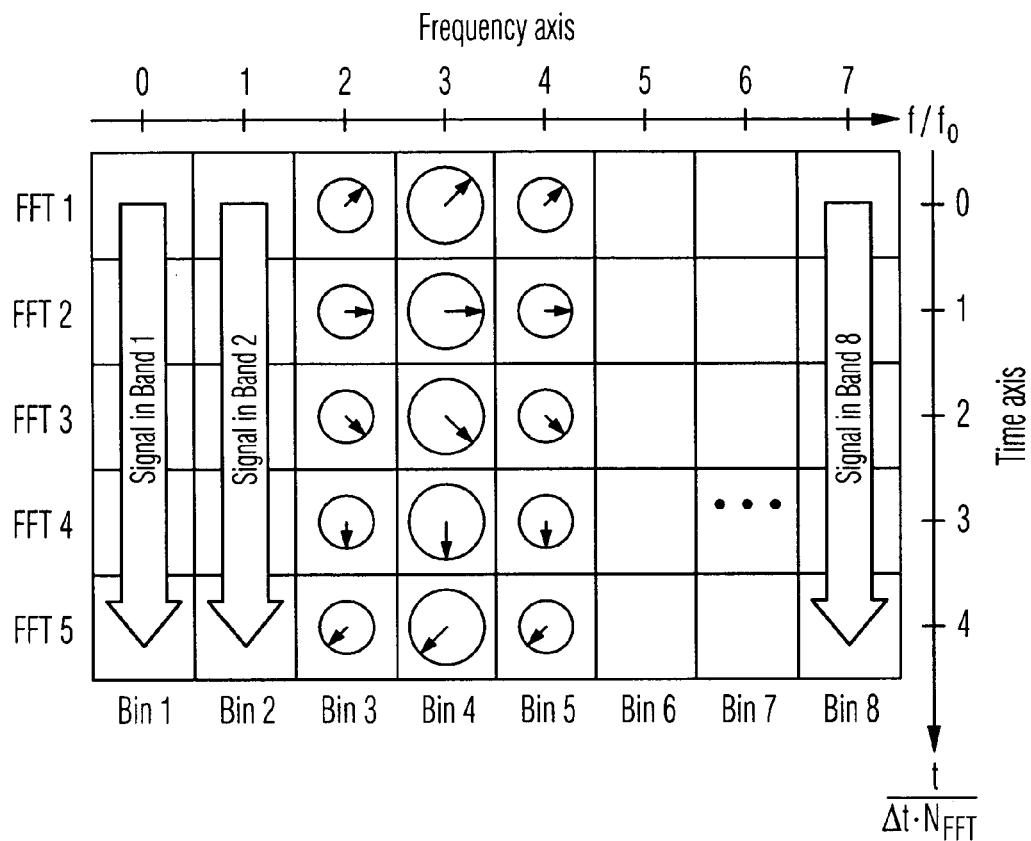
FIG. 5 shows a frequency-time diagram of an application according to the invention of a Fast Fourier Transform filter bank.

By way of summary, the frequency-time diagram of the FFT filter bank in FIG. 5 once again shows the connections between the time domain and the frequency domain with an FFT filter bank according to the invention, which, via several Fast Fourier transformers $FFT_1$, $FFT_2$, $FFT_3$, $FFT_4$ and $FFT_5$, generates a total of $N_{FFT}=8$ frequency bands, which correspond respectively to the individual signal paths of the FFT filter bank in FIG. 3, with a bandwidth at the level of the bin width $f_0$ of the FFTs.

Figure 6:
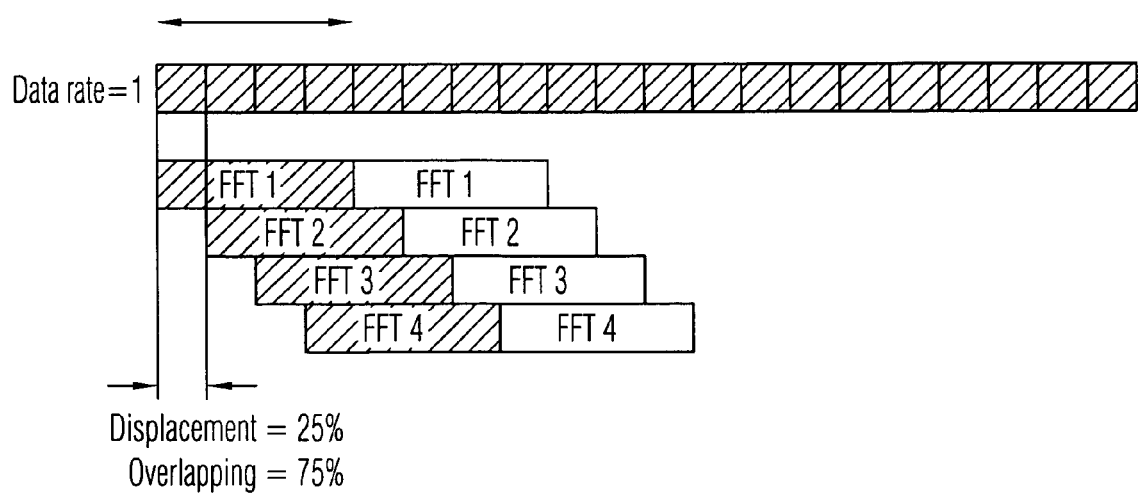
FIG. 6 shows a schematic display of a FFT filter bank consisting of FFTs with a time-overlap.

The individual Fast Fourier transformers $FFT_1$, $FFT_2$, $FFT_3$, $FFT_4$ and $FFT_5$ of the FFT filter bank need not be connected cyclically one after the other, but can also provide a time overlap as shown in FIG. 6. This arrangement corresponds to the Welch method known from the prior art. The respective $N_{FFT}$ sampling values at the outputs of the respective $N_{FFT}$ signal paths of the FFT filter bank 1 are present according to FIG. 3 at the positions $x_1(\mu \cdot \Delta t \cdot N_{FFT} \cdot (1-\text{overlap}))$, $x_2(\mu \cdot \Delta t \cdot N_{FFT} \cdot (1-\text{overlap}))$, ..., $x_{NFFT}(\mu \cdot \Delta t \cdot N_{FFT} \cdot (1-\text{overlap}))$. By comparison with the non-overlapping FFTs, there is therefore an oversampling by the factor $$\frac{1}{1-\text{overlap}}.$$

Additionally, the overlap in the case of a sinusoidal interference signal with a frequency $f_k$, which provides a frequency difference $\Delta f_0$ from the mid-frequency of the FFT bin ($f_k = \nu \cdot f_0 + \Delta f_0$), brings about a rotating phasor, which provides a faster rotational velocity $$\frac{\Delta f_0}{1-\text{overlap}}.$$

The overlapping of the individual FFT window of the FFT filter bank 1 leads to a correlation between the values of the measured signal. As a result of the overlap, oversampled FFT results are obtained. The overlapping factor ov is obtained with an overlap according to equation (5):

$$ov = \frac{1}{1-\text{overlap}} \quad (5)$$

Only FFT results with a difference of ov or more are formed from non-overlapping FFT windows of the FFT filter bank 1. The oversampling is compensated by an undersampling by a factor $$\frac{1}{1-\text{overlap}}$$

in the individual FFTs. In this manner, un-correlated noise sampling values, and therefore also a white noise signal necessary for the eigenvalue analysis of autocorrelation matrices, is provided.

If only an undersampling by the factor $N_{FFT}$ is implemented in the individual undersamplings of the FFTs of the FFT filter bank, as shown in FIG. 3, then a data sequence $x_v(\mu) = x_v(\mu \cdot \Delta t)$ is obtained at the output of the FFTs for the frequency band v as shown in equation (6), wherein $w(\mu)$ models the noise, and the summated term models the total of p sinusoidal interference signals:

$$x_v(\mu) = w(\mu) + \sum_{k=1}^{P} A_k \cdot e^{j(\mu \omega_k + \varphi_k)} \quad (6)$$

An undersampling by the factor $N_{FFT}(1-\text{overlap})$ in the individual FFTs of the FFT filter bank 1 leads to a non-oversampled data sequence $x_1(\mu \cdot ov)$ according to equation (7) only for every ov-$^{th}$ value:

$$x_v(\mu \cdot ov) = w(\mu \cdot ov) + \sum_{k=1}^{P} A_k \cdot e^{j(\mu \cdot ov \cdot \omega_k + \varphi_k)} \quad (7)$$

According to equation (8), the scaled angular frequency $\omega_{norm,k}$ is the non-oversampled angular frequency $\omega_k$ scaled to the bin width $f_0$ of the FFT filter bank of the spectral line associated with a sinusoidal interference signal and represents the frequency difference $\Delta f_0$ of the spectral line at the frequency $v \cdot f_0$ of the nearest FFT bin, which corresponds to the mid-frequency $v \cdot f_0$ of the respective frequency band.

$$\omega_{norm,k} = ov \cdot \frac{2\pi f_k}{f_0} \quad (8)$$

The scaled angular frequency $\omega_{norm,k}$ therefore provides a value range $[-\pi, +\pi]$. At $\omega_{norm,k} = \pm \pi$, the associated spectral line is disposed exactly at the right-hand or left-hand edge of the respective FFT bin and can also be found with the same strength in the adjacent frequency band.

According to equation (9) the ideal autocorrelation matrix R, which provides, for example, the dimension M×M, is obtained from a non-oversampled output signal $x_v(\mu \cdot ov)$ at the output of the FFT associated with the frequency band v. Sampled values disposed at a past time of the non-oversampled output signal $x_v(\mu \cdot ov)$ are used for this purpose:

$$R = E\{\underline{x} \cdot \underline{x}^+\} \text{mit} \underline{x} = [x(\mu), x(\mu - ov), \ldots, x(\mu - M \cdot ov)]^T \quad (9)$$

[mit=with]

The autocorrelation matrix R is a square, positive and definite matrix, that is to say, its eigenvalues are real and positive. The eigenvectors, associated with the non-equal eigenvalues, are also orthogonal.

As a result of the stochastic—noise-laden—character of the non-oversampled output signal $x_l(\mu \cdot ov)$ at the output of the FFT filter bank 1, a reliable estimate for the autocorrelation matrix $\hat{R}_v$ according to equation (10) is determined through multiple averaging—a total of $N_{avg}$ times:

$$\hat{R}_v = \frac{1}{N_{avg}} \sum_{\mu=(M-1) \cdot ov}^{(M-1) \cdot ov + N_{avg} - 1} \begin{bmatrix} x(\mu) \\ x(\mu - ov) \\ \vdots \\ x(\mu - (M-1) \cdot ov) \end{bmatrix} \quad (10)$$

$$[x^*(\mu), x^*(\mu - ov), \ldots, x^*(\mu - (M-1) \cdot ov)]$$

According to equation (11), the dimension M of the estimate ($\hat{R}_v$) of the autocorrelation matrix associated with the frequency band (v) for the identification according to the invention of sinusoidal interference signals in a noise signal must correspond at least to the maximum expected number $p_{max}$ of spectral lines per frequency band v with the addition of the value 2. The value 2 results from the fact that the MUSIC method requires at least two noise eigenvalues.

$$M \geq P_{max} + 2 \quad (11)$$

In the special case, in which the matrix dimension M similarly adopts the value 1, starting from equation (10), the Welch method, known from the prior art for the calculation of the noise spectrum in the case of time-overlapping FFTs, is derived according to equation (12) for the autocorrelation matrix ($\hat{R}_v$).

$$\hat{R}_v = \frac{1}{N_{avg}} \cdot \sum_{k=0}^{N_{avg}-1} x_v(k) \cdot x_v^*(k) = \hat{S}(v \cdot f_0) \quad (12)$$

According to the MUSIC (Multiple Signal Classification) method, the M eigenvalues $\lambda_1, \ldots, \lambda_M$ associated with the estimated value $\hat{R}_v$ of the autocorrelation matrix and the associated eigenvectors $\underline{v}_1, \ldots, \underline{v}_M$ of the respective frequency band v are calculated after a total of $N_{avg}$ averaging stages according to equation (10).

The eigenvalues of the autocorrelation matrix can be subdivided into two groups. The first group of the lowest eigenvalues, of which the number M–p is equal to the dimension M of autocorrelation matrix $\hat{R}_v$ reduced by the number p of sinusoidal interference signals present in the frequency band v, are associated with the noise components of the measured signal $x(n \cdot ov)$. The second group of the remaining eigenvalues, which are associated with the signal components—in the present case with the sinusoidal interference signals—and of which the number therefore corresponds to the number p sinusoidal interference signals, each provide a significant value difference relative to each of the respective lowest eigenvalues associated with the noise components.

No deterministic method exists for separating all eigenvalues $\lambda_1, \ldots, \lambda_M$ of the estimate $\hat{R}_v$ of the autocorrelation matrix associated with the frequency band v into the first and second group of eigenvalues and therefore for the determination of the number p of sinusoidal interference signals in the measured signal $x(n \cdot ov)$. According to the prior art, only a statistical analysis of the eigenvalues by means of histogram can be used in order to separate the eigenvalues $\lambda_1, \ldots, \lambda_M$.

In the case of an ideal autocorrelation matrix R, the lowest eigenvalues $\lambda_1, \ldots, \lambda_{M-p}$ associated with the noise components are identical and, according to equation (13), equal to the noise power $\sigma_w^2$.

$$\sigma_w^2 = \lambda_i \text{ for } i \in [1, \ldots, M-p] \quad (13)$$

In the case of a numerically-estimated autocorrelation matrix $\hat{R}_i$, the noise eigenvalues $\lambda_1, \ldots, \lambda_{M-p}$ are distributed about the actual noise power $\sigma_w^2$ as a mean value. In this case, the noise power $\sigma_w^2$ is determined according to equation (14):

$$\sigma_w^2 = \frac{1}{M-p} \sum_{k=1}^{M-p} \lambda_k \quad (14)$$

The variance $\sigma$ of the noise eigenvalues according to equation (15) declines with an increasing averaging duration $N_{avg}$.

$$\sigma = \sqrt{\frac{1}{k} \sum_{i=1}^{k} |\lambda_i - \mu|^2} \quad (15)$$

The scaled angular frequencies $\omega_{norm,k}$ of the spectral lines associated with the individual sinusoidal interference signals of a frequency band $\nu$ are determined with the assistance of an estimation function, which is based upon the eigenvalue analysis of autocorrelation matrices. These methods, which form the prior art, are described in detail in Manon H. Hayes: "Statistical digital signal processing and modelling", John Wiley & sons. Inc., 1996, page 451 to 469. The MUSIC (Multiple Signal Classification) method and respectively the Root MUSIC method are presented here briefly, without going into the details, only by way of example.

With the pure MUSIC method, on the basis of the eigenvectors $\underline{v}_i$ associated with the noise components and an arbitrary column vector $\underline{e}(\omega_{normk})$ of the signal correlation matrix $R_s$ according to equation (16), an estimation function $P_{MU}(e^{j\omega_{normk}})$ according to equation (17) is formed:

$$\underline{e}(\omega_{normk}) = [1, e^{j\omega_{normk}}, e^{j2\omega_{normk}}, \ldots, e^{j(M-1)\omega_{normk}}] \quad (16)$$

$$P_{MU}(e^{j\omega_{normk}}) = \frac{1}{\sum_{i=1}^{M-p} |\underline{e}^+(\omega_{normk}) \cdot \underline{v}_i|^2} \quad (17)$$

As shown in detail in Manon H. Hayes: "Statistical digital signal processing and modelling", John Wiley & sons. Inc., 1996, page 451 to 469, each of the eigenvalues $\underline{v}_i$ associated with the individual noise components is orthogonal to an arbitrary column vector $\underline{e}(\omega_{normk})$ of the signal autocorrelation matrix $R_s$ with a scaled angular frequency $\omega_{norm,k}$ of a sinusoidal interference signal in the non-oversampled output signal $x_i(n \cdot ov)$ at the output of the FFT filter bank 1. In this case, the scalar product $\underline{e}(\omega_{normk}) \cdot \underline{v}_i$ is zero, and accordingly, the estimation function $P_{MU}(e^{j\omega_{normk}})$ is at a maximum. The scaled angular frequencies $\omega_{norm,k}$ at the respective p largest maxima of the estimation function $P_{MU}(e^{j\omega_{normk}})$ therefore represent the scaled angular frequencies $\omega_{norm,k}$ of the sinusoidal interference signals in the non-oversampled output signal $x_i(n \cdot ov)$ at the output of the FFT filter bank 1. In this manner, with the estimation function $P_{MU}(e^{j\omega_{normk}})$, an estimation function for the identification of the scaled angular frequencies $\omega_{norm,k}$ of the sinusoidal interference signals in the non-oversampled output signal $x_i(n \cdot ov)$ is obtained at the output of the FFT filter bank 1.

The calculation of the estimation function $P_{MU}(e^{j\omega_{normk}})$ via the angular frequency $\omega_{norm,k}$, which represents a pseudo spectrum, can be advantageously implemented via an FFT. In this context, the FFT length determines the frequency resolution of the calculated estimation function $P_{MU}(e^{j\omega_{normk}})$.

In the case of the Root MUSIC Method, the Z-transform $V_i(z)$ of the individual eigenvectors $v_i$ respectively associated with the noise components is determined. For this purpose, the individual components $v_i(l)$ of the respective noise eigenvectors $v_i$ are subjected to a Z-transformation according to equation (18):

$$V_i(z) = \sum_{l=0}^{M-1} v_i(k) \cdot z^{-l} \quad \text{for all } i = 1, \ldots, M-p \quad (18)$$

The estimates for the total of p scaled angular frequencies $\omega_{norm,k}$ of the sinusoidal interference signals result from the angles of the p zero points of the polynomial D(z) calculated from the Z-transform $V_i(z)$ according to equation (19), which are disposed nearest on the unit circle of the complex z-plane:

$$D(z) = \sum_{i=1}^{M-p} V_i(z) V_i^*(1/z^*) \quad (19)$$

The scaled angular frequencies $\omega_{normk}$ can only be determined with an accuracy of modulus $2\pi$, both with the pure MUSIC method via the FFT calculation of the pseudo spectrum and also with the Root-MUSIC method using the zero-point search on the unit circle of the complex z-plane, so that, in particular, the scaled angular frequencies $\omega_{normk}$ at the edges of the respective frequency band cannot be identified unambiguously. An unambiguous identification can only be achieved by combining the results determined in the individual frequency bands.

The power levels $P_{MUi,k}$ of the respective p sinusoidal interference signals at the scaled angular frequencies $\omega_{normk}$ of a frequency band $\nu$ are obtained from the solution of the equation system (20), as is also shown in detail in Manon H. Hayes: "Statistical digital signal processing and modelling", John Wiley & sons. Inc., 1996, page 459 to 463, $$\sum_{k=1}^{p} P_{MUi,k} \cdot |V_i(e^{j\omega_{normk}})| = \lambda_i - \sigma_w \quad \text{for all } i = 1, \ldots, p \quad (20)$$

The Z-transform $V_i(e^{j\omega_{normk}})$ of the eigenvectors $\underline{v}_i$ associated with the respective p interference signal components are obtained from equation (21) with reference to equation (18) for the M–p noise-component eigenvectors:

$$V_i(e^{j\omega_k}) = \sum_{l=0}^{M-1} v_i(l) e^{-j\omega_{normk} l} \quad \text{for all } i = 1, \ldots, p \quad (22)$$

The eigenvectors $\lambda_{M-p+1}, \lambda_{M-p+2}, \ldots, \lambda_M$ associated with the p sinusoidal interference signals are the largest eigenvectors, arranged respectively in ascending order, of the estimated value $\hat{R}_\nu$ of the autocorrelation matrix for the frequency band $\nu$. $\sigma_w$ is the noise power predominating in the respective frequency band $\nu$. The vectorial presentation of equation system (20) is derived from equation system (22):

$$\begin{bmatrix} |V_{M-p+1}(e^{j\omega_{norm1}})|^2 & |V_{M-p+1}(e^{j\omega_{norm2}})|^2 & \cdots & |V_{M-p+1}(e^{j\omega_{normp}})|^2 \\ |V_{M-p+2}(e^{j\omega_{norm1}})|^2 & |V_{M-p+2}(e^{j\omega_{norm2}})|^2 & \cdots & |V_{M-p+2}(e^{j\omega_{normp}})|^2 \\ \vdots & \vdots & \ddots & \vdots \\ |V_M(e^{j\omega_{norm1}})|^2 & |V_M(e^{j\omega_{norm2}})|^2 & \cdots & |V_M(e^{j\omega_{normp}})|^2 \end{bmatrix} \begin{bmatrix} P_{MUv,1} \\ P_{MUv,2} \\ \vdots \\ P_{MUv,p} \end{bmatrix} = \begin{bmatrix} \lambda_{M-p+1} - \sigma_w^2 \\ \lambda_{M-p+2} - \sigma_w^2 \\ \vdots \\ \lambda_M - \sigma_w^2 \end{bmatrix} \quad (22)$$

After the power level $P_{MUv,k}$ and the scaled angular frequencies $\omega_{normk}$ of the respective p(v) sinusoidal interference signals have been determined for every frequency band v, for example, using the MUSIC method, as presented above, the results of the individual frequency bands v must be combined to form a combined result. In this context, it must be taken into consideration that spectral lines of sinusoidal interference signals are obtained in adjacent frequency bands because of the windowing of the FFT filter bank 1.

The problem of frequency-band-wide superimposition is already known from the prior art in the context of the time overlap of several FFTs (overlapped FFT). The time overlap in this context serves to compensate the non-constant window-transmission function with regard to an approximately constant evaluation of all spectral values in the entire frequency range. According to the prior art, an estimation of the frequency spectrum generated through an FFT filter bank 1 with overlapping in the time domain is realised by means of the Welch method.

As shown in detail in Manon H. Hayes: "Statistical digital signal processing and modelling", John Wiley & sons. Inc., 1996, page 415 to 420, the expected value $E\{\hat{S}_{Welch}(e^{j\omega})\}$ of a frequency spectrum generated from several time-overlapped FFTs according to equation (23) is derived from the convolution of the frequency spectrum $S(e^{j\omega})$ generated through an FFT filter bank 1 with the modulus-squared window transmission function $H(e^{j\omega})$:

$$E\{\hat{S}_{Welch}(e^{j\omega})\} = S(e^{j\omega}) * |H(e^{j\omega})|^2 \quad (23)$$

The variance of a frequency spectrum of this kind generated via the Welch method tends toward zero with an increasing averaging length.

The above Welch method is used according to the invention, to achieve an unambiguous identification of main and subsidiary lines within one of the frequency bands v, which can be assigned to several sinusoidal interference signals with frequencies in different frequency bands. The individual frequency bands are overlapped in the time domain for this purpose as shown in FIG. 6.

The expected value for a frequency spectrum of an FFT filter bank 1 consisting of several spectral lines is derived starting from equation (23) using the Welch method according to equation (24):

$$E\{\hat{S}_{Welch}(e^{j\omega})\} = \sum_k (P_k \cdot \delta(\omega - \omega_k)) * |H(e^{j(\omega)})|^2 = \sum_k P_k \cdot |H(e^{j(\omega - \omega_k)})|^2 \quad (24)$$

Since the frequency spectrum generated by the FFT filter bank 1 and then modified using the Welch method is only calculated at the discrete frequencies $f_0$ of the FFT bins, the expected value of a frequency spectrum of an FFT filter bank 1 consisting of several spectral lines is obtained according to equation (25):

$$E\{\hat{S}_{Welch}(e^{jv2\pi f_0})\} = \sum_k P_k \cdot |H(e^{j(v2\pi f_0 - 2\pi f_k)})|^2 \quad (25)$$

For the frequencies $f_k$ of the individual spectral lines, the relationship in equation (26) applies, in which the frequency $f_k$ of the spectral line is classified in the FFT frequency grid by specifying the frequency offset $\Delta f_0$ relative to the nearest FFT bin.

$$f_k = v \cdot f_0 + \Delta f_{0k} = v \cdot f_0 + \frac{\omega_{norm}}{2\pi} f_0 \quad (26)$$

Accordingly, for every scaled angular frequency $\omega_{normk}$, there is an individual expected value $\hat{S}_{Welch}(e^{jv2\pi f_0})$ for the frequency spectrum at the discrete frequency $f_0$ of the FFT bin in the frequency band v.

Accordingly, the power level $P_{MUv}$, determined, for example, by means of the MUSIC method, of a spectral line at the scaled angular frequency $\omega_{normk}$ in the frequency band v is derived according to equation (27) as the expected value $\hat{S}_{Welch}(e^{jv2\pi f_0})$ for the frequency spectrum, which is calculated from the sum of all respective power levels $P_k$ multiplicatively linked with the modulus-squared, window transmission function frequency-displaced by the frequency $f_k$ with approximately identical scaled angular frequency $\omega_{normk}$ and accordingly identical frequency offset $\Delta f_0$ relative to the respective FFT bin frequency:

$$P_{MUv} = E\{\hat{S}_{Welch}(e^{jv2\pi f_0})\} = \sum_k P_k \cdot |H(e^{j(v2\pi f_0 - 2\pi f_k)})|^2 \quad (27)$$

All spectral lines, of which the scaled angular frequencies $\omega_{normk}$ provide an angular-frequency difference $\Delta\omega_{normk}$ according to equation (28), which is smaller than a maximum angular-frequency difference $\Delta\omega_{normMax}$, are counted as spectral lines in different frequency bands v with approximately identical scaled angular frequency $\omega_{normk}$.

$$\Delta\omega_{normk} < \Delta\omega_{normMax} \ll \pi \quad (28)$$

Figure 7:
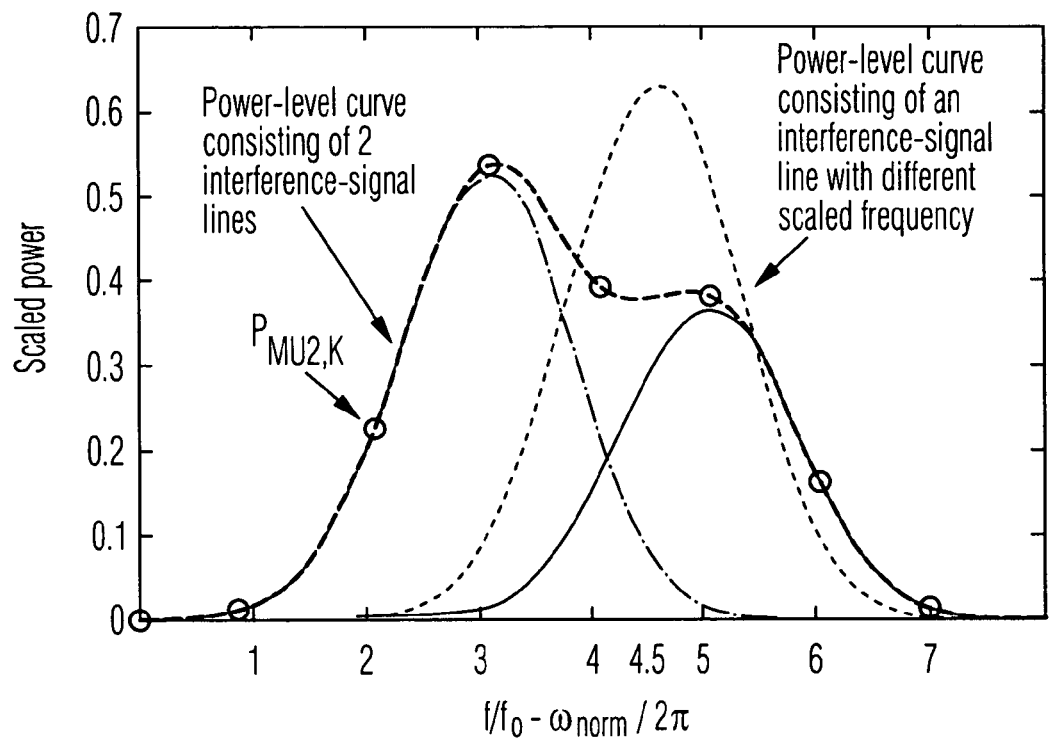
FIG. 7 shows a spectral display of power-level curves.
Figure 8:
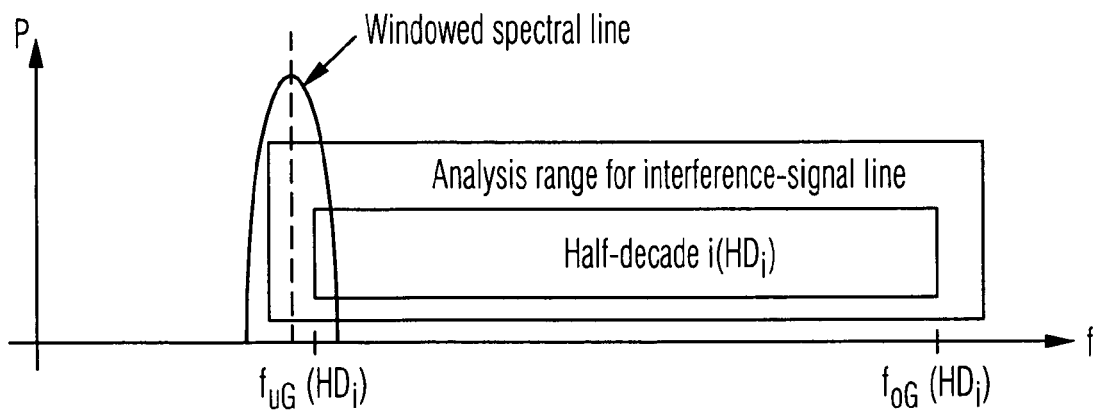
FIG. 8 shows a spectral display of the analysis range for interference-signal spectral lines at half-decade thresholds.

The power levels $P_{MUv}$ at the individual FFT bin frequencies $v \cdot f_0$, which can be calculated for each given scaled angular frequency $\omega_{normk}$ according to equation (28), are obtained in sum for each given scaled angular frequency $\omega_{normk}$ in a power-level curve according to FIG. 7.

The number p(v) of sinusoidal interference signals, the scaled frequencies $\omega_{normk}$ and the power levels $P_{MUv}$ of the respective spectral lines associated with the p(v) sinusoidal interference signals are derived using the MUSIC method and the subsequent Welch method for each frequency band v. Ambiguity continues to exist with regard to the frequencies $f_k$ and the power level $P_k$ of those spectral lines, which contribute to the power-level curve with approximately identical scaled angular frequency $\omega_{normk}$ in adjacent frequency bands ν at the respective FFT bin frequency ν·$f_0$.

For the determination presented below of the individual power levels $P_k$ of those spectral lines, which contribute to the power-level curve with approximately identical scaled angular frequency $\omega_{normk}$ in adjacent frequency bands ν at the respective FFT bin frequency ν·$f_0$, a weighted, scaled angular frequency $\overline{\omega}_{normk}$ according to equation (29) is introduced in the individual frequency bands ν instead of the scaled angular frequency $\omega_{normk}$:

$$\overline{\omega}_{normk} = \triangleleft \sum_{v} P_{MUv} \cdot e^{j\omega_{normkv}} \tag{29}$$

By taking into consideration the power levels $P_{MUv}$ in the weighted, scaled angular frequency $\overline{\omega}_{normk}$, the scaled angular frequencies $\omega_{normkv}$ of spectral lines, which provide a higher power level $P_{MUv}$, are more heavily weighted. Through the use of the complex exponential function $e^{j\omega_{normkv}}$ for the scaled angular frequency $\omega_{normv}$, in particular, at the frequency band edges ($\omega_{normkv} = \pm\pi$), the value of the scaled angular frequency $\omega_{normkv}$ is preserved in the averaging.

Starting from equation (27), the relationship between the power levels $P_{MUv}$ determined, for example, using the MUSIC method in the frequency band ν at a given weighted, scaled angular frequency $\overline{\omega}_{normk}$ and the linear combination of the sought power levels $P_k$ of spectral lines, which result from sinusoidal interference signals with angular frequencies $\omega_k$ in adjacent frequency bands ν±i and which are superimposed at the power level $P_{MUv}$ of the power-level curve in the frequency band ν, is described by the equation system (30). The angular frequencies $\omega_k$ of the main lines and subsidiary lines associated respectively with a sinusoidal interference signal, which are associated in sum with a common power-level curve, are disposed respectively in adjacent frequency bands ν±i and all provide the identical frequency difference $\Delta f_0$ at the respective frequency band mid-frequency or respective FFT bin frequency (ν±i)·$f_0$. The power-level curves begin respectively in the frequency band $n_{Start}$ and extend over a total of $N_{LP}$ frequency bands. In the equation system (30), it is assumed that a main line of a sinusoidal interference signal could be disposed in each of the total of $N_{LP}$ frequency bands.

unambiguous solution is obtained for the estimated vector $\hat{\underline{P}}$ of the sought power level $P_k$ according to equation (32):

$$\hat{\underline{P}} = H^{-1} \cdot \underline{P}_{MU} \tag{32}$$

Through the error vector $\underline{e}$, error power-level values $\hat{P}_k$ can occur, some of which can also be negative. In a case of this kind, by resolving the optimisation problem according to equation (33), which guarantees a non-negative estimated vector $\hat{\underline{P}}$ for the sought power-level values $P_k$, a better solution can be achieved than by resolving the equation system (32).

$$\min_{\hat{p}} \left\| H \cdot \hat{\underline{P}} - \hat{\underline{P}}_{MU} \right\|^2 \text{ under subsidiary condition } \hat{p} > 0 \tag{33}$$

The frequency $f_k$ of the spectral line found, for example, by means of the MUSIC algorithm, is determined according to equation (34) from the number $\nu_{Bin}$ of the associated frequency band (counted from 1 to $N_{FFT}$) with the addition of the weighted, scaled angular frequency $\overline{\omega}_{normk}$.

$$f_k = \left( (\nu_{Bin} - 1) + \frac{\overline{\omega}_{normk}}{2\pi} \right) \cdot f_0 \tag{34}$$

If only one sideband—in the case of a real measured signal $x(t)$—is evaluated, then the respectively-determined power-level value $\hat{P}_k$ must still be multiplied by the factor 2.

After all of the main lines and subsidiary lines, associated with all of the sinusoidal interference signals present in the noise signal have been identified, either a frequency and power level comparison of the identified sinusoidal interference signals can be carried out with reference interference signals in the framework of an evaluation, or, as described below, a removal according to the invention of the identified spectral lines associated with sinusoidal interference signals can be implemented. Alternatively, spectral lines, of which the frequencies are known, for example, in the case of the disturbance of the noise signal by system hum, can also be removed without the identification according to the invention $$\begin{bmatrix} |H(\overline{\omega}_{normk} \cdot f_0)|^2 & |H(-2\pi f_0 + \overline{\omega}_{normk} \cdot f_0)|^2 & \cdots & |H(-(N_{LP}-1)2\pi f_0 + \overline{\omega}_{normk} \cdot f_0)|^2 \\ |H(2\pi f_0 + \overline{\omega}_{normk} \cdot f_0)|^2 & |H(\overline{\omega}_{normk} \cdot f_0)|^2 & \cdots & |H(-(N_{LP}-2)2\pi f_0 + \overline{\omega}_{normk} \cdot f_0)|^2 \\ \vdots & \vdots & \ddots & \vdots \\ |H((N_{LP}-1)2\pi f_0 + \overline{\omega}_{normk} \cdot f_0)|^2 & |H((N_{LP}-2)2\pi f_0 + \overline{\omega}_{normk} \cdot f_0)|^2 & \cdots & |H(\overline{\omega}_{normk} \cdot f_0)|^2 \end{bmatrix} \cdot \begin{bmatrix} \hat{P}_{n_{start}} \\ \hat{P}_{n_{start}+1} \\ \vdots \\ \hat{P}_{n_{start}+N_{LP}-1} \end{bmatrix} = \begin{bmatrix} P_{MU,n_{start}} \\ P_{MU,n_{start}+1} \\ \vdots \\ P_{MU,n_{start}+N_{LP}-1} \end{bmatrix} + \begin{bmatrix} e_{n_{start}} \\ e_{n_{start}+1} \\ \vdots \\ e_{n_{start}+N_{LP}-1} \end{bmatrix} \tag{30}$$

The equation system (30) can be presented in an equivalent manner via the short form of equation (31).

$$H \cdot \hat{\underline{P}} = \underline{P}_{MU} + \underline{e} \tag{31}$$

The error vector $\underline{e} = [e_{n_{start}}, e_{n_{start}+1}, \ldots, e_{n_{start}+N_{LP}-1}]^T$ represents the error of the MUSIC algorithm in the respective power-level curve. If the error vector $\underline{e}$ is set to zero, then an described above using the method according to the invention for the removal of sinusoidal interference signals from a noise signal.

The starting point is a list with frequencies $f_k$, at which sinusoidal interference signals occur. The removal of the spectral lines associated with the sinusoidal interference signals takes place, once again, by analogy with the detection of interference-signal spectral lines, in several frequency bands generated by an FFT filter bank 1. The list can contain positive frequencies $f_k$ associated with real sinusoidal interference signals or positive and negative frequencies $f_k$ associated with complex interference-signal rotating phasors. For reasons of simplicity, the removal of real interference signals will be considered below.

After determining the number $L_H$ of frequency bands or respectively FFT bins, which are covered by a window function $|H(f)|^2$ (corresponding, for example, to the frequency range, in which the window function $|H(f)|^2$ exceeds a given threshold value), the variables $p(\nu=1, \ldots, N_{FFT}/2)$, which count the number of interference-signal spectral lines per frequency band $\nu$, are initialised—when observing one sideband—with the value zero for every frequency band from 1 up to $N_{FFT}/2$.

For every frequency $f_k$, at which a spectral line can occur, a test of the Nyquist criterion is carried out as a selection criterion. If the frequency $f_k$ does not satisfy the Nyquist criterion (condition in equation (35)), then the frequency $f_k$ is discarded and no longer pursued.

$$f_k > f_s/2 = 1/(\Delta t \cdot 2) \tag{35}$$

Following this, the number $\nu_{center}$ of the FFT bin or the respective frequency band according to equation (36), in which the main line of the sinusoidal interference signal with the frequency $f_k$ is disposed, is determined:

$$\nu_{center} = \text{round}\left(\frac{f_k}{f_s} \cdot N_{FFT}\right) + 1 \tag{36}$$

Starting from the determined number $\nu_{center}$ of the FFT bins or the respective frequency band, in which the main line of the sinusoidal interference signal with the frequency $f_k$ falls, the counting variables $p(\nu)$ of those frequency bands according to equation (38), which are disposed within the window function in the frequency range, are incremented.

$$p(\nu) = p(\nu) + 1 \text{ for all } \nu = \nu_{center} - \frac{L_H - 1}{2}, \ldots, \nu_{center} + \frac{L_H - 1}{2} \tag{37}$$

If the list with frequencies $f_k$, at which sinusoidal interference signals occur, contains an estimate for the difference of the power-level value $\hat{P}_k$ of the spectral line of the noise level associated with the sinusoidal interference signal in addition to the frequencies $f_k$, the number $L_H$ of the frequency bands or respectively FFT bins for those spectral lines, of which the power levels $\hat{P}_k$ are disposed only slightly above the noise level, could be reduced in order to cut down the calculation time.

When considering both sidebands or one respective sideband, the estimate $\hat{R}_\nu$ of the autocorrelation matrix associated with the frequency band $\nu$ is determined for each of the total of $N_{FFT}$ or respectively $N_{FFT}/2$ frequency bands, starting from the time-discrete output signal $x_\nu(\mu \cdot o\nu)$ of the FFT filter bank 1 associated with the respective frequency band $\nu$.

According to equation (38), for the removal according to the invention of sinusoidal interference signals in a noise signal, the dimension $M(\nu)$ of the estimate $\hat{R}_\nu$ of the autocorrelation matrix associated with the frequency band $\nu$ must correspond at least to the number $p(\nu)$, identified above, of spectral lines per frequency band $\nu$ with the addition of the value 1:

$$M(\nu) \geq p(\nu) + 1 \tag{38}$$

In this manner, the dimension $M(\nu)$ of the estimate $\hat{R}_\nu$ of the autocorrelation matrix associated with a frequency band $\nu$ for the method according to the invention for the removal of sinusoidal interference signals from a noise signal can generally be interpreted as smaller than the dimension $M$ of the estimate $\hat{R}_\nu$ for the method according to the invention for the detection of sinusoidal interference signals in a noise signal according to equation (11).

Moreover, the averaging lengths $N_{avg}$, in the case of the determination of the estimate $\hat{R}_\nu$ of the autocorrelation matrix associated with a frequency band $\nu$, can be designed to be smaller for the removal of spectral lines by comparison with the detection of spectral lines.

The determination of the estimate $\hat{R}_\nu$ of the autocorrelation matrix associated with the frequency band $\nu$ for the method according to the invention for the removal of spectral lines corresponds to the procedure in the method according to the invention for the identification of spectral lines according to equation (10).

Starting from the estimate $\hat{R}_\nu$ of the autocorrelation matrix associated with the respective frequency band $\nu$, the noise power $\sigma_{w,\nu}$ associated with the frequency band $\nu$ is then determined.

If no spectral line is present within the frequency band $\nu-p(\nu)=0$—, then the noise-power spectrum $\hat{S}(\nu)$ is derived from the averaging of the spur elements of the estimate $\hat{R}_\nu$ of the autocorrelation matrix associated with a frequency band $\nu$ according to the equation (39):

$$\hat{S}(\nu) = \sigma_{w,\nu}^2 = \frac{1}{M} \sum_{k=1}^{M} \hat{R}_\nu(k, k) \tag{39}$$

This corresponds to the Welch method for spectral estimation known from the prior art.

With at least one spectral line per frequency band $\nu-p(\nu)>0$—the total of M eigenvalues $\lambda_1, \ldots, \lambda_M$ of the M-dimensional estimate $\hat{R}_\nu$ of the autocorrelation matrix associated with a frequency band $\nu$ is sorted via an analysis of eigenvalues of $\hat{R}_\nu$ and in ascending order of their value $-\lambda_1 \leq \lambda_2 \leq \ldots \leq \lambda_M$. According to equation (40), the noise-power spectrum $\hat{S}(\nu)$ is once again derived with reference to equation (14) from the averaging of the $M-p(\nu)$ lowest eigenvalues $\lambda_1 \leq \lambda_2 \leq \ldots \leq \lambda_{M-p(\nu)}$ of the estimate $\hat{R}_\nu$ of the autocorrelation matrix associated with the frequency band $\nu$, which correspond to the noise eigenvalues of the matrix $\hat{R}_\nu$:

$$\hat{S}(\nu) = \sigma_{w,\nu}^2 = \frac{1}{M - p(\nu)} \sum_{k=1}^{M-p(\nu)} \lambda_k \tag{40}$$

On the basis of the mathematical background described above, the subroutines for measurement of a noise-power spectrum, identification of sinusoidal interference signals in a noise signal and removal of sinusoidal interference signals from a noise signal and the method according to the invention for noise measurement with the combinable subroutines of measurement, identification and removal of sinusoidal interference signals in a noise signal are described below.

Figure 9:
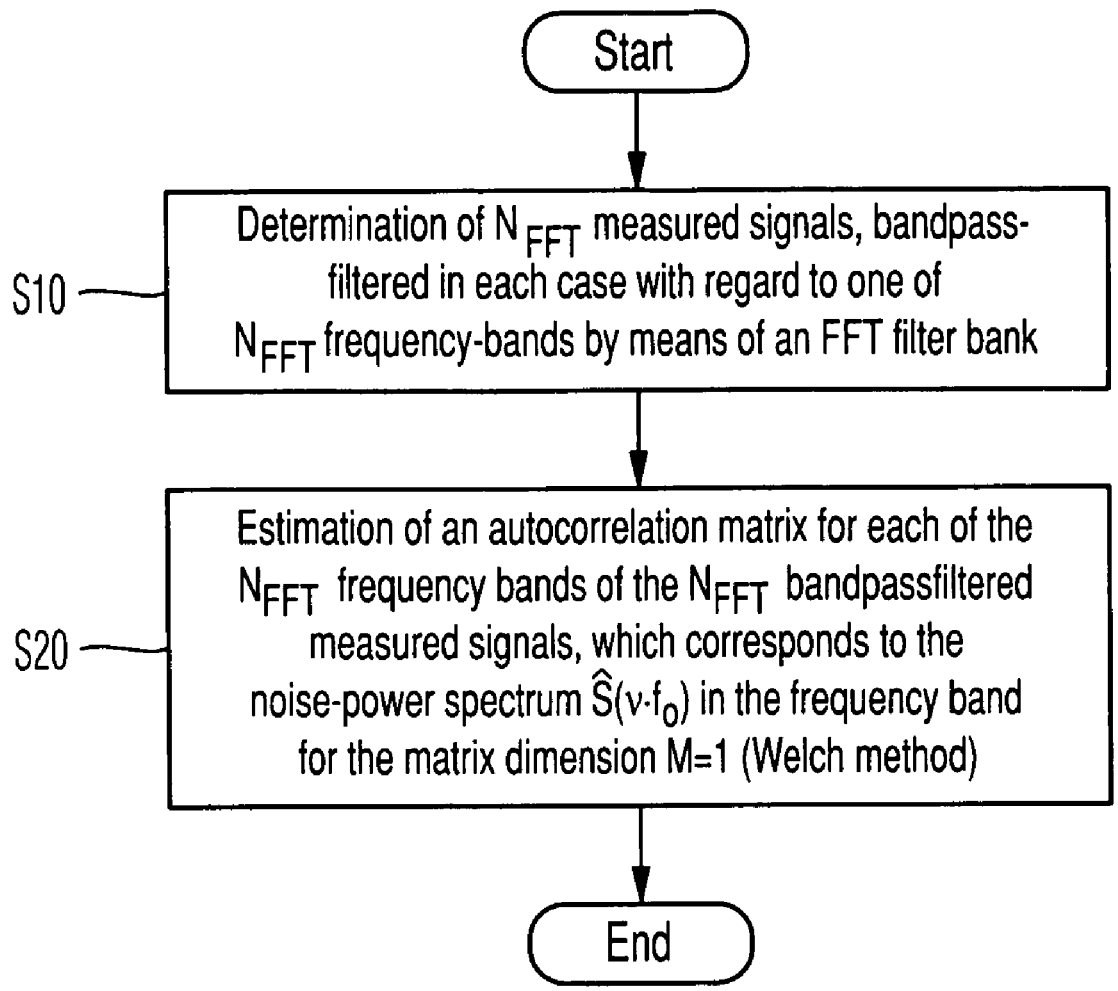
FIG. 9 shows a flow chart for a subroutine according to the prior art for the measurement of a noise-power spectrum.

The subroutine for the measurement of a noise-power spectrum according to FIG. 9 begins in procedural stage S10 with the splitting of a continuous or time-discrete measured signal $x(t)$ or $x(\mu \cdot \Delta t)$, which represents a noise signal $w(t)$ or $w(\mu \cdot \Delta t)$ with superimposed sinusoidal interference signals $A_k \cdot e^{j(\omega_k t + \phi_k)}$ or $A_k \cdot e^{j(\mu \cdot \omega_k \Delta t + \phi_k)}$, by means of an FFT filter bank 1 according to equation (1) into a total of $N_{FFT}$ measured signals, of which the frequency spectrum is bandpass-filtered respectively to a frequency band $\nu$. Each of these measured signals at the output of the FFT filter bank 1 is generated by one FFT of the FFT filter bank 1, wherein the respective bandpass-filtering of the measured signal is implemented via a windowing $2_1, 2_2, \ldots, 2_{NFFT}$ and subsequent down mixing $3_1, 3_2, \ldots, 3_{NFFT}$ via the FFT. The individual FFTs of the FFT filter bank 1 read in the respective measured signal at the input of the FFT filter bank 1 with a time offset and therefore operate with a time overlap with reference to the measured signal at the input. The oversampling of the individual FFT results caused because of this time overlap of the individual FFTs according to equation (7) is compensated by a complementary undersampling in subsequent undersamplings $4_1, 4_2, \ldots, 4_{NFFT}$. In order to generate a total of $N_{FFT}$ measured signals of a given frequency band $\nu$ respectively bandpass-filtered with regard to their frequency spectrum at the output of the FFT filter bank 1, the bandwidth of the output signal of the individual FFTs is limited respectively to one FFT bin length $f_0$.

In the next procedural stage S20, starting from a total of $N_{FFT}$ measured signals, respectively bandpass-filtered with reference to their frequency spectrum to a given frequency band $\nu$, an estimate $\hat{R}_\nu$ of the autocorrelation matrix associated with each frequency band $\nu$ is determined according to equation (10). As a result of the stochastic characteristic of the noise signal, in this context, the unbiased quality of the estimate $\hat{R}_\nu$ of the respective autocorrelation matrix is increased by multiple averaging. According to equation (10), the maximum dimension M of the autocorrelation matrices for the calculation of the noise-power spectrum $\hat{S}(\nu \cdot f_0)$ with superimposed spectral lines of sinusoidal interference signals associated with the respective frequency bands $\nu$ is reduced according to the Welch method to the value 1.

Figure 10:
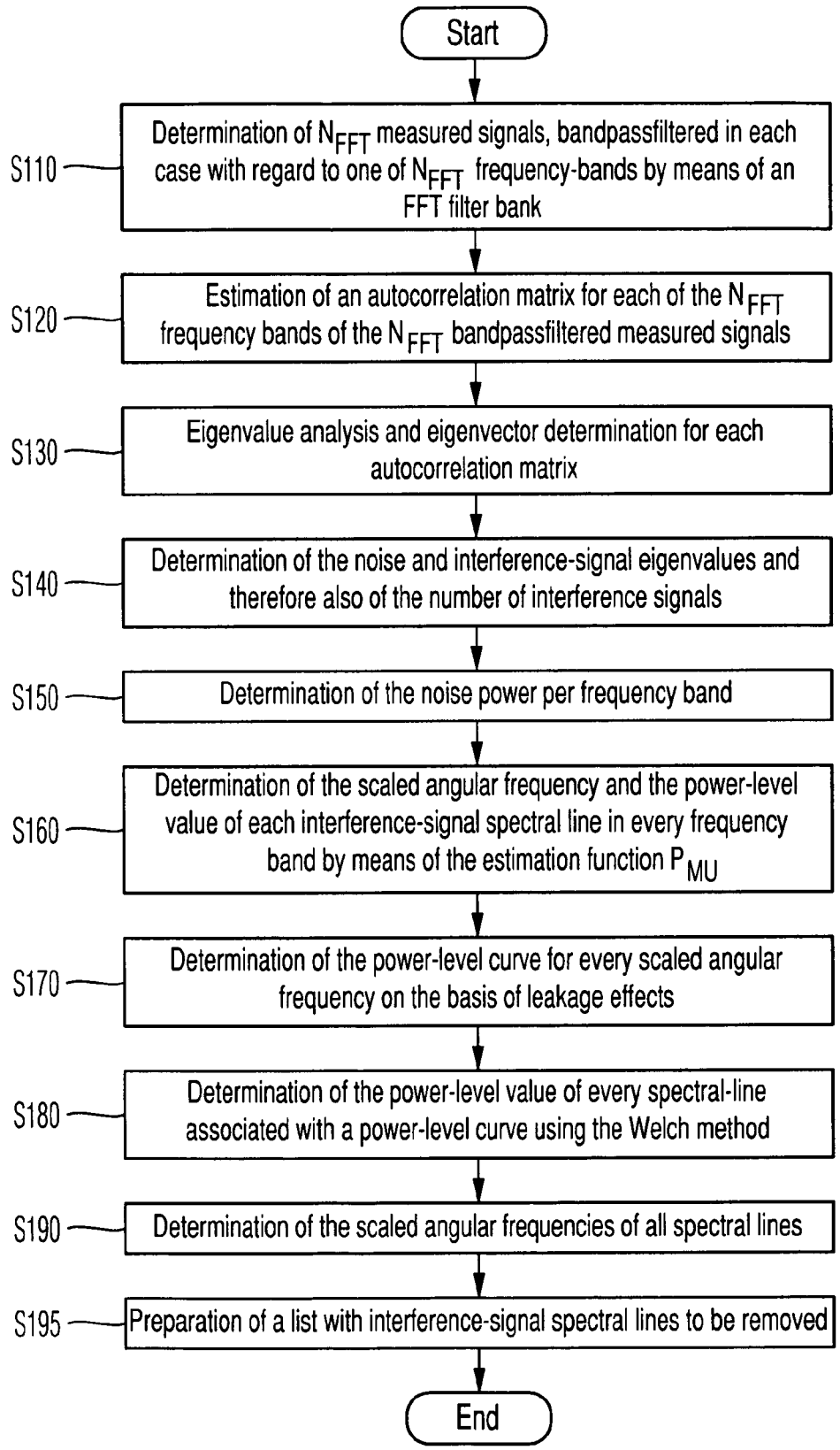
FIG. 10 shows a flow chart for a subroutine according to the invention for the detection of sinusoidal interference signals in a noise signal.

The subroutine according to the invention for the identification of the interference-signal spectral lines in a noise-power spectrum according to FIG. 10 provides in its two first procedural stages S110 and S120 identical procedural stages to the two procedural stages S10 and S20 of the subroutine for the measurement of a noise-power spectrum according to FIG. 9. The only difference relative to the subroutine for the measurement of a noise-power spectrum is that the matrix dimension of the respective autocorrelation matrices $\hat{R}_\nu$ for the subroutine for the identification of interference-signal spectral lines is specified as at least the maximum expected number $P_{max}$ of interference-signal spectral lines per frequency band $\nu$ with the addition of the value 2.

The next procedural stage S130 of the subroutine according to the invention for the identification of interference-signal spectral lines comprises the determination of the eigenvalues $\lambda_1, \ldots, \lambda_M$ and the associated eigenvectors $\underline{v}_1, \ldots, \underline{v}_M$ of each of the total of $N_{FFT}$ estimates $\hat{R}_\nu$ of the autocorrelation matrix associated with each frequency band $\nu$, which is implemented according to known mathematical methods for eigenvalue analysis of matrices and the determination of corresponding eigenvectors based upon these methods.

In the next procedural stage S140, for every frequency band $\nu$ and accordingly for the estimate $\hat{R}_\nu$ of the autocorrelation matrix associated with each frequency band $\nu$, a subdivision of all respectively determined eigenvalues $\lambda_1, \ldots, \lambda_M$ into a first group of eigenvalues $\lambda_1, \ldots, \lambda_{M-p(\nu)}$ associated with the noise components and into a second group of eigenvalues $\lambda_{M-p(\nu)+1}, \ldots, \lambda_M$ associated with the sinusoidal interference signal components is implemented. With the number of noise eigenvalues $\lambda_1, \ldots, \lambda_{M-p(\nu)}$ and the number of interference-signal eigenvalues $\lambda_{M-p(\nu)+1}, \ldots, \lambda_M$, the number $p(\nu)$ of sinusoidal interference signals per frequency band $\nu$ is determined from procedural stage S140.

In the next procedural stage S150, the noise power $\sigma_{w,\nu}$ of each frequency band $\nu$ is calculated according to equation (14) with the determined noise eigenvalues.

In the next procedural stage S160, the scaled angular frequencies $\omega_{normk}$ of the sinusoidal interference signals disposed in the respective frequency band $\nu$ are determined by determining an estimation function $P_\nu$ associated with the respective frequency band $\nu$, which is based upon the eigenvalues and eigenvectors of the estimate $\hat{R}_\nu$ of the autocorrelation matrix associated with the respective frequency band $\nu$, and by evaluating this estimation function $P_\nu$. The MUSIC (Multiple Signal Classification) estimation function $P_{MU,\nu}$ presented in equation (17) can be used, by way of example, as the estimation function $P_\nu$. Alternatively, other estimation methods based upon the eigenvalue analysis of autocorrelation matrices can also be used. According to equation (17), the MUSIC estimation function $P_{MU,\nu}$ provides maxima at those angular frequencies $\omega_{normk}$, at which respectively an eigenvector $\underline{v}_i$ associated with a noise component is orthogonal to an arbitrary column vector $\underline{e}_i$ of the signal autocorrelation matrix $R_s$ and at which, accordingly, the scalar product in the denominator expression comprising respectively an eigenvector $\underline{v}_i$ associated with a noise component and an arbitrary column vector $\underline{e}_i$ of the signal autocorrelation matrix $R_s$ is zero. The scaled angular frequencies $\omega_{normk}$ of the sought sinusoidal interference signals are derived from the scaled angular frequencies $\omega_{normk}$ of the largest maxima of the estimation function $P_{MU,\nu}$ corresponding to the number of interference-signal eigenvalues $\lambda_{M-p(\nu)+1}, \ldots, \lambda_M$.

In procedural stage S160, the determination of the power-level values $P_{MU,\nu,k}$ associated with the individual sinusoidal interference signals for each frequency band $\nu$ is additionally implemented by resolving the linear equation systems (20). For this purpose, the respective noise power $\sigma_{w,\nu}$, all of the interference-signal eigenvalues and the Z-transform $V_i(e^{j\omega_{normk}})$ of the eigenvectors $\lambda_{M-p(\nu)+1}, \ldots, \lambda_M$ obtained from the individual interference-signal eigenvalues $\underline{v}_{M-p(\nu)+1}, \ldots, \underline{v}_M$ are required for each frequency band $\nu$, wherein the individual Z-transforms $V_i(e^{j\omega_{normk}})$ calculated at the individual scaled angular frequencies $e^{j\omega_{normk}}$ of the sinusoidal interference signals are obtained through the estimation function $P_{MU,\nu,k}$.

In the next procedural stage S170, all of the spectral lines with their respective power-level values $P_{MU,\nu,k}$, which were identified in the previous procedural stage S160 in the individual frequency bands $\nu$ at an approximately identical, scaled angular frequency $\omega_{normk}$, are combined to form a combined power-level curve according to FIG. 7. The difference $\Delta\omega_{normk}$ between the two scaled angular frequencies, which, according to condition (28), must be smaller than a specified maximum angular-frequency difference $\Delta\omega_{normkMAx}$, is used as the criterion for approximately-equal angular frequencies $\Delta\omega_{normk}$ of spectral lines. For every scaled angular frequency $\Delta\omega_{normk}$, the respective power-level curve is derived from the power-level values $P_{MU,\nu,k}$ localised at the individual FFT bin frequencies $f_0$, respectively assigned to the individual frequency bands $\nu$.

The spectral lines respectively identified at a given scaled angular frequency $\Delta\omega_{normk}$ in the individual frequency bands ν in procedural stage S160 can be derived respectively from a superimposition of several spectral lines. This superimposition can result from main lines and subsidiary lines of one or more sinusoidal interference signals, of which the frequency is disposed in a frequency band ν, and at least one subsidiary line of at least one further sinusoidal interference signal, of which the frequencies are disposed in frequency bands ν±i adjacent to the frequency band ν and which come to be disposed in the frequency band ν as a result of the leakage effect.

In procedural stage S180, the power-level values $\hat{P}_k$ of the individual spectral lines, which result from sinusoidal interference signals with frequencies in different frequency bands ν±i, are determined by resolving the linear equation systems (30) and (33). The power-level values $P_{MU,\nu,k}$ disposed in the preceding procedural stage S170 at the individual FFT bin frequencies ν·$f_0$ of the spectral lines of the respective sinusoidal interference signals, determined in procedural stage S160, for example, using the MUSIC method, and the modulus-squared window transmission functions $|H(f)|^2$ frequency-displaced by the individual FFT bin frequencies ν·$f_0$ of the FFT filter bank 1 are entered in the linear equation systems (30) and (33), applicable for a respectively scaled angular frequency $\omega_{normk}$. Ignoring an error vector integrated in the equation systems (30) and (33), which models the process error achieved with the MUSIC method, the individual power-level values $\hat{P}_k$ of the individual spectral lines are calculated by inversion of the matrix H formed with the individual window-transmission functions $|H(f)|^2$ and subsequent multiplication by the vector $P_{MU,\nu}$ from the power-level values $P_{MU,\nu,k}$ determined by means of the MUSIC method in the individual frequency bands ν according to equation (32). Alternatively, the individual power-level values $\hat{P}_k$ of the individual spectral lines can also be determined by minimising the error vector e within the context of a minimisation method according to equation (33).

In the next procedural stage S190, the respective frequency $f_k$ is determined for every spectral line according to equation (34).

In the final procedural stage S195, a list is prepared with all of the spectral lines at the frequencies $f_k$, which are to be removed.

Figure 11:
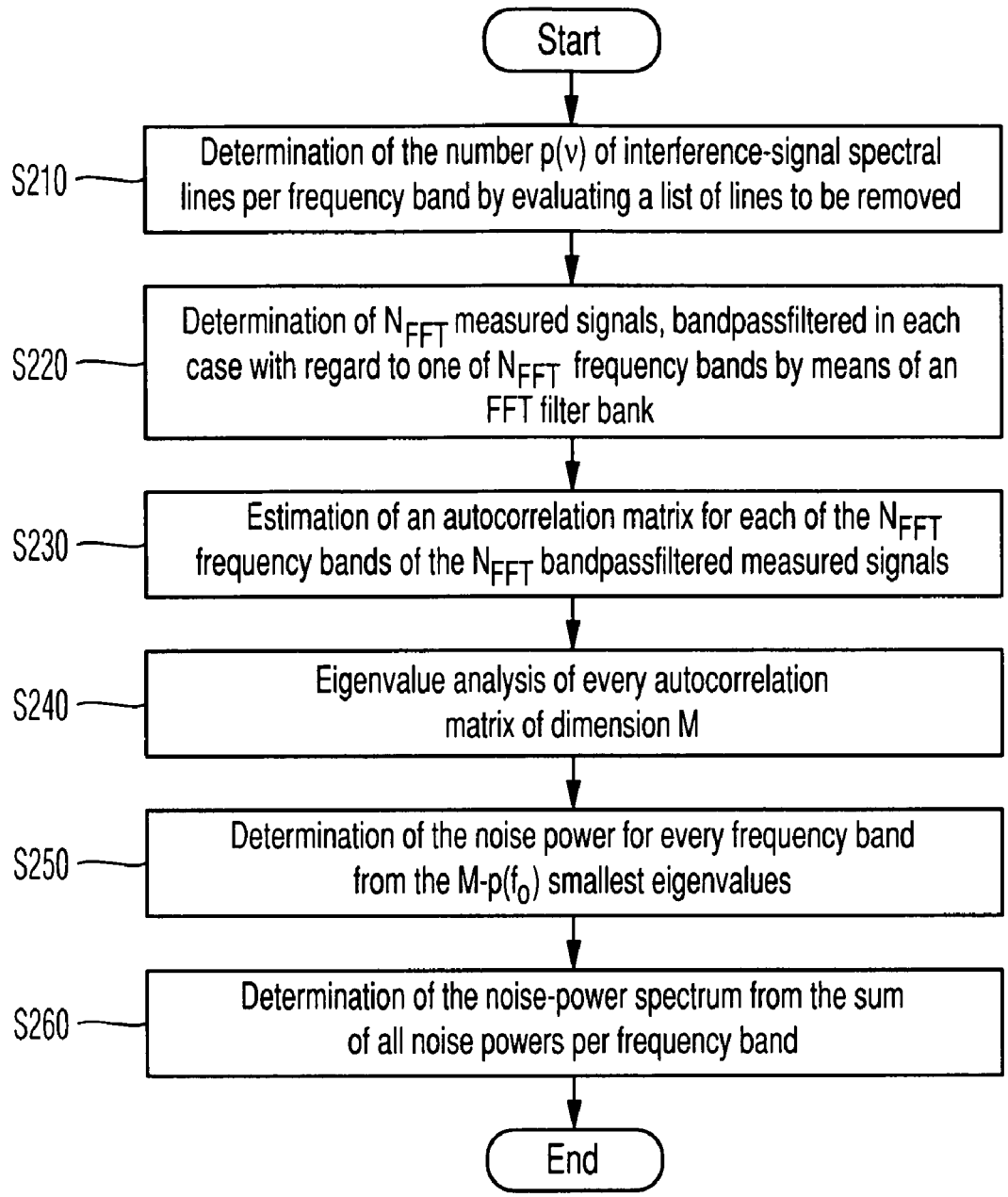
FIG. 11 shows a flow chart for a subroutine according to the invention for the removal of sinusoidal interference signals from a noise signal.

In the following section, the subroutine according to the invention for the removal of sinusoidal interference signals from a noise signal according to FIG. 11 is described:

In the first procedural stage S210, the number p(ν) of interference-signal spectral lines to be removed is determined for every frequency band ν, starting from the list of all sinusoidal interference signals identified in the frequency range as prepared in procedural stage S195 of the subroutine according to the invention for the identification of sinusoidal interference signals. In this context, all spectral lines, of which the frequencies according to equation (35) do not satisfy the Nyquist condition and which are not useful for further processing are discarded. The frequency band $\nu_{Center}$, in which the main line of the sinusoidal interference signal comes to be disposed, is calculated according to equation (36), in order to determine the number p(ν) of interference-signal spectral lines per frequency band ν to be removed, starting from the frequency $f_k$ of the identified sinusoidal interference signal. All frequency bands according to equation (37), in which respectively a main line or one of the subsidiary lines of the sinusoidal interference signal are disposed, are incremented on this basis.

In the next procedural stage S220, by analogy with procedural stage S10 in the subroutine according to the invention for the measurement of sinusoidal interference signals in a noise signal or respectively procedural stage S110 of the subroutine for the identification of sinusoidal interference signals in a noise signal, a total of $N_{FFT}$ measured signals, of which the frequency spectra are bandpass-filtered respectively with reference to one of the frequency bands ν, is determined. The total of $N_{FFT}$ measured signals, of which the frequency spectra are bandpass-filtered respectively with regard to one of the frequency bands ν, is determined according to equation (1) via an FFT filter bank 1.

In the next procedural stage S230 of the subroutine according to the invention for the removal of sinusoidal interference signals in a noise signal, by analogy with procedural stage S20 of the subroutine for the measurement of the noise-power spectrum or respectively procedural stage S120 of the subroutine according to the invention for the identification of sinusoidal interference signals in a noise signal, a respective estimate $\hat{R}_\nu$ of an autocorrelation matrix associated with each frequency band ν is calculated starting from the total of $N_{FFT}$ measured signals, of which the frequency spectra are bandpass-filtered respectively with regard to one of the frequency bands ν according to equation (10). In this context, the matrix dimension M(ν) of the autocorrelation matrix $\hat{R}_\nu$ associated with the frequency band ν is, however, adjusted at least to the number p(ν) of interference-signal spectral lines with the addition of the value 1. As a result of the stochastic characteristic of the noise signal, the unbiased quality of the estimate $\hat{R}_\nu$ of the respective autocorrelation matrix associated with each frequency band ν is increased by multiple averaging.

The next procedural stage S240 contains the eigenvalue analysis, using a known mathematical method, of each of the autocorrelation matrices, which are assigned to each frequency band ν.

With reference to the number p(ν) of noise eigenvalues determined in procedural stage S210 for each frequency band ν, in procedural stage S250, the respective noise power $\sigma_{w,\nu}$ is calculated for each frequency band ν from the sum of the M(ν)−p(ν) smallest eigenvalues, wherein M(ν) is the dimension of the estimate $\hat{R}_\nu$ of the autocorrelation matrix associated with the frequency band ν.

In procedural stage S260, the total discrete noise-power spectrum $\hat{S}(\nu \cdot f_0)$ is determined from the noise powers $\sigma_{w,\nu}$ associated with each of the individual frequency bands ν, which were determined in the previous procedural stage S250.

Figure 12:
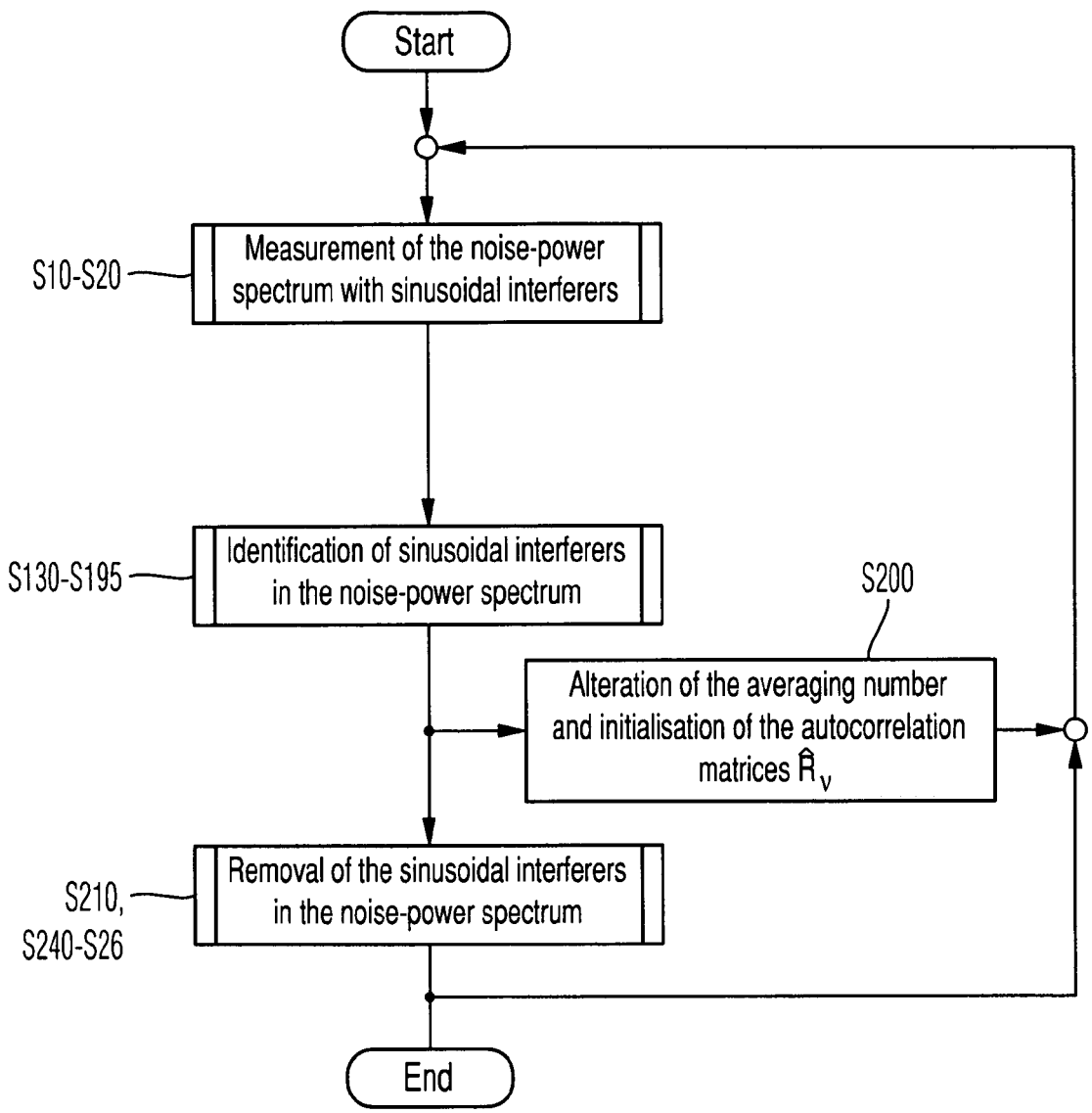
FIG. 12 shows a flow chart for a first embodiment of the method according to the invention for noise measurement with the combinable subroutines according to the invention for the measurement, identification and removal of sinusoidal interference signals from a noise signal.

In the following section, the first embodiment of the method according to the invention for noise measurement with the combinable subroutines for the measurement, identification and removal of sinusoidal interference signals in a noise signal is described with reference to FIG. 12:

In the first embodiment of the method according to the invention for noise measurement with the combinable subroutines for the measurement, identification and removal of sinusoidal interference signals in a noise signal according to FIG. 12, the two procedural stages of analysis of the measured signal x(t) or x(ν·Δt) into a total of $N_{FFT}$ measured signals, bandpass-filtered respectively to one of the $N_{FFT}$ frequency bands and calculation of the autocorrelation matrix $\hat{R}_\nu$ respectively associated with a frequency band ν are calculated only once in procedural stages S10 and S20 for all three subroutines for the measurement, identification and removal of interference-signal spectral lines in a noise-power spectrum. In this context, the matrix dimension M of the respective autocorrelation matrix $\hat{R}_\nu$ is specified according to equation (11) for all three subroutines together at the maximum required value of the maximum expected number $P_{max}$ of interference-signal spectral lines per frequency band ν with the addition of the value 2. For the calculation of the noise-power spectrum $\hat{S}(v \cdot f_0)$ in procedural stage S20 of the subroutine for the measurement of the noise-power spectrum with sinusoidal interferers, only the mean value of the elements $\hat{R}_v(k,k)$ (k=1, ..., M) of the respective autocorrelation matrix $\hat{R}_v$ is taken.

After the calculation of the noise-power spectrum with sinusoidal interferers in procedural stages S10 and S20, the identification of sinusoidal interferers in the noise-power spectrum is implemented in the remaining required procedural stages S130 to S195 of the first embodiment. (Procedural stages S110 and S120 of the subroutine according to the invention for the identification of sinusoidal interferers in a noise-power spectrum have already been processed in procedural stages S10 and S20 of the subroutine for the measurement of the noise-power spectrum with sinusoidal interferers).

In the case of a high noise variance of the measured signal $x(t)$ or $x(v \cdot \Delta t)$ and accordingly a problematic identification of the sinusoidal interferers in the noise-power spectrum, in procedural stage S200, the number $N_{avg}$ of the averagings of the estimate $\hat{R}_v$ of the respective autocorrelation matrix to be implemented is increased within the framework of an initialisation of the respective autocorrelation matrices and accordingly, the stochastic noise component in the measured signal $x(t)$ or $x(v \cdot \Delta t)$ is minimised by comparison with the deterministic interference-signal spectral lines, and the procedure for measuring the noise-power spectrum is re-started in procedural stage S10.

Finally, after the identification of the sinusoidal interferers in the noise-power spectrum according to procedural stages S130 to S195, the removal of the identified sinusoidal interferers from the noise-power spectrum is implemented in the remaining required stages S210, S240 to S260 of the first embodiment. The procedural stages S220 and S230 of the subroutine according to the invention for the removal of sinusoidal interferers from a noise-power spectrum have already been processed in procedural stages S10 and S20 of the subroutine for the measurement of the noise-power spectrum with sinusoidal interferers.

After the removal of the sinusoidal interferers from the noise-power spectrum, the measurement of the noise-power spectrum is re-started cyclically in procedural stage S10.

Figure 13:
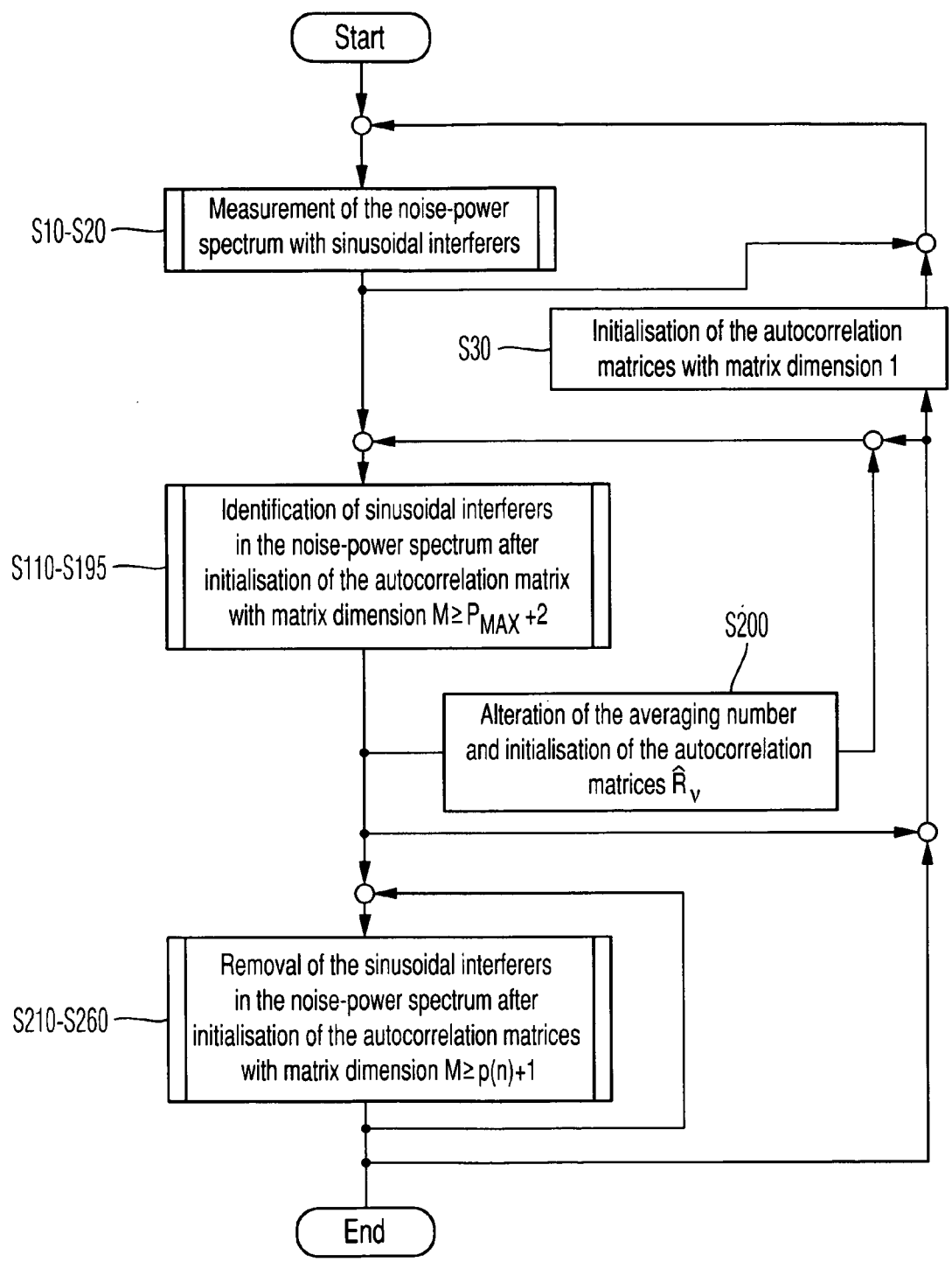
FIG. 13 shows a flow chart for a second embodiment of the method according to the invention for noise measurement with the combinable subroutines according to the invention for the measurement, identification and removal of sinusoidal interference signals from a noise signal.

The following section describes the second embodiment of the method according to the invention for noise measurement with the combinable subroutines for the measurement, identification and removal of sinusoidal interference signals in a noise signal with reference to FIG. 13.

In the second embodiment of the method according to the invention for noise measurement with the combined subroutines for the measurement, identification and removal of sinusoidal interference signals in a noise signal with reference to FIG. 13, subroutine-specific matrix dimensions M for the autocorrelation matrices $\hat{R}_v$ associated with the respective frequency bands $v$ are used for each of the three subroutines of measurement, identification and removal.

In the first procedural stages S10 and S20, which are identical to those of the subroutine for the measurement of the noise-power density in FIG. 9, the autocorrelation matrices $\hat{R}_v$ each have the dimension M=1 and are therefore calculated in an efficient manner with regard to calculation time. In this manner, it is possible to calculate the noise-power density in realtime quasi-continuously; this is indicated by the feedback branch to the start of the flow diagram adjoining procedural stage S20.

If the user of the noise measurement system intends to identify the occurring interference-signal spectral lines, the autocorrelation matrices $\hat{R}_v$ associated with the respective frequency bands $v$ are re-initialised with a dimension M, which corresponds to the maximum expected number $P_{max}$ of interference-signal spectral lines per frequency band $v$ with the addition of the value 2. The subroutine according to the invention for the identification of sinusoidal interferers in a noise-power spectrum is implemented with the autocorrelation matrices $\hat{R}_v$ initialised with the new matrix dimension M in procedural stages S110 to S195.

If the identification of the sinusoidal interferers in the noise-power spectrum with the maximum matrix dimension $M=P_{max}+2$ for the individual autocorrelation matrices proves difficult because of the high noise variance, in procedural stage S200, by analogy with the first embodiment in FIG. 12, the user can achieve a stronger averaging out of the stochastic noise-signal components in the measured signal and therefore a more accurate identification of the interference-signal spectral lines by increasing the averaging number $N_{avg}$ within the framework of an initialisation of the individual autocorrelation matrices $\hat{R}_v$. The subroutine for the identification of sinusoidal interferers in the noise-power spectrum is repeated in procedural stage S110 with the new averaging number $N_{avg}$.

If the subroutine for the identification of sinusoidal interferers in a noise-power spectrum is not repeated—which is the normal case—the individual autocorrelation matrices $\hat{R}_v$ are initialised in procedural stage S30 with the matrix dimension M=1 for the measurement of the noise-power spectrum in procedural stages S10 and S20.

Following the implementation of the subroutine for the identification of sinusoidal interferers in a noise-power spectrum, if the user intends to remove the identified sinusoidal interferers from the noise-power spectrum, the autocorrelation matrix $\hat{R}_v$ associated with the respective frequency band $v$ is initialised with the respective matrix dimension M(v), which corresponds to the number p(v) of sinusoidal interferers identified in the frequency band $v$ with the addition of the value 1.

The subroutine for the removal of the sinusoidal interferers in a noise-power spectrum is then implemented with the re-initialised autocorrelation matrices $\hat{R}_v$ in procedural stages S210 to S260. This subroutine can be implemented by the user several times—which is indicated by the feedback branch from the end of procedural stage S260 to the beginning of procedural stage S210—because the calculations are less calculation-intensive by comparison with the subroutine for the identification of sinusoidal interferers as a result of the matrix dimension.

If the user does not wish to repeat the removal of identified sinusoidal interferers, the individual autocorrelation matrices $\hat{R}_v$ are initialised in procedural stage S30 with the matrix dimension M=1 for the measurement of the noise-power spectrum in procedural stages S10 and S20.

Figure 14:
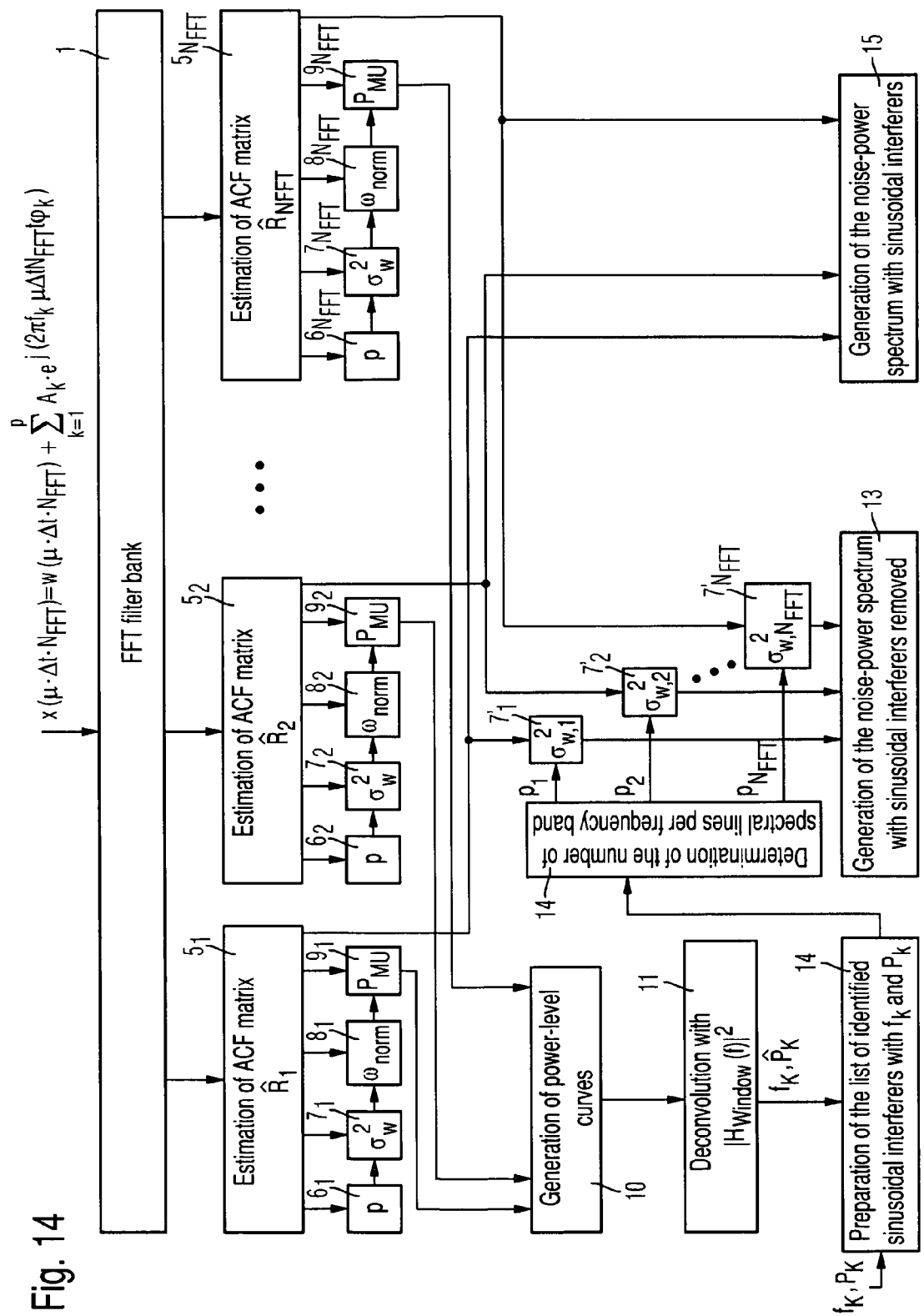
FIG. 14 shows a block diagram of a system according to the invention for noise measurement with the combinable functions according to the invention for the measurement, identification and removal of sinusoidal interference signals in a noise signal.

The following section describes the system according to the invention for noise measurement with the combinable subroutines for the measurement, identification and removal of sinusoidal interference signals in a noise signal with reference to FIG. 14.

The continuous or time-discrete measured signal $x(t)$ or $x(v \cdot \Delta t)$ consists of a continuous or time-discrete noise signal $w(t)$ or $w(v \cdot \Delta t)$ and several continuous or time-discrete sinusoidal interference signals $A_k \cdot e^{j(\omega_k t + \phi_k)}$ or $A_k \cdot e^{j(\mu \cdot \omega_k \Delta t + \phi_k)}$. This continuous or time-discrete measured signal $x(t)$ or $x(v \cdot \Delta t)$ is processed in an FFT filter bank 1, of which the structure is presented in detail in FIG. 3, in a total of $N_{FFT}$ overlapping FFTs. The respective frequency spectra of the continuous and time-discrete measured signal $x(t)$ or $x(v \cdot \Delta t)$ are bandpass-filtered with regard to a given frequency band $v$ in the windowings $2_1, 2_2, \ldots, 2_{NFFT}$ assigned to the individual FFTs and in the subsequent down mixings $3_1, 3_2, \ldots, 3_{NFFT}$. The individual measured signals, of which the frequency spectrum is bandpass-filtered with regard to a frequency band v, are then restored in subsequent undersamplings $4_1, 4_2, \ldots, 4_{NFFT}$, with regard to the oversampling caused by the overlapping, to the original sampling rate according to FIG. 3.

The measured signals $x(v \cdot ov \cdot \Delta t)$, of which the respective frequency spectrum is bandpass-filtered with regard to a frequency band v, are supplied at the total of $N_{FFT}$ outputs of the FFT filter bank 1, to the units $5_1, 5_2, \ldots, 5_{NFFT}$ for the estimation of the autocorrelation matrix $\hat{R}_v$. The individual eigenvalues and eigenvectors of the estimate $\hat{R}_v$ of the autocorrelation matrix associated with each frequency band v are additionally determined in the respective units $5_1, 5_2, \ldots, 5_{NFFT}$ for the estimation of the autocorrelation matrix $\hat{R}_v$, from the estimate $\hat{R}_v$ associated with each frequency band v of the autocorrelation matrix.

In a subsequent unit $6_1, 6_2, \ldots, 6_{NFFT}$ for determining the number $p(v)$ of interference signals per frequency band v, a separation of all eigenvalues $\lambda_1, \ldots, \lambda_M$ determined at the estimated value $\hat{R}_v$ of the autocorrelation matrix associated with the frequency band v into noise eigenvalues $\lambda_1, \ldots, \lambda_M$ and interference eigenvalues $\lambda_1, \ldots, \lambda_{M-p(v)}$ takes place. The number $p(v)$ of interference signals per frequency band v corresponds to the number of determined interference-signal eigenvalues $\lambda_{M-p(v)+1}, \ldots, \lambda_M$ of the estimate $\hat{R}_v$ associated with the frequency band v of the autocorrelation matrix.

The subsequent units $7_1, 7_2, \ldots, 7_{NFFT}$ determine respectively the noise power $\sigma_{w,v}$ of the frequency band v from the noise eigenvalues $\lambda_1, \ldots, \lambda_{M-p(v)}$, which corresponds respectively to a given number of smallest eigenvalues determined in the units $5_1, 5_2, \ldots, 5_{NFFT}$ for the estimation of the autocorrelation matrix $\hat{R}_v$, wherein the given number represents the dimension M reduced by the number $p(v)$ of interference signals per frequency band v of the estimate $\hat{R}_v$ associated with the frequency band v of the autocorrelation matrix.

The subsequent units $8_1, 8_2, \ldots, 8_{NFFT}$ for frequency estimation determine, for example, via the MUSIC method using an estimation function by means of a maximum value observation, the scaled angular frequencies $\omega_{normk}$ of the interference-signal spectral lines occurring in the respective frequency band v. In this context, the maxima occur in those cases, in which the eigenvectors $\underline{v}_1, \ldots, \underline{v}_{M-p(v)}$ associated with the respective noise eigenvalues $\lambda_1, \ldots, \lambda_{M-p(v)}$ are orthogonal to an arbitrary column vector $\underline{e}_i$ of the signal autocorrelation matrix $R_s$ of the respective frequency band v.

Finally, the power-level values $P_{MU,v,k}$ associated with the individual interference-signal spectral lines in the individual frequency bands v are determined in subsequent units $9_1, 9_2, \ldots, 9_{NFFT}$ for power-level measurement, starting from the noise powers $v_{w,v}$, the interference-signal eigenvalues $\lambda_{M-p(v)+1}, \ldots, \lambda_M$ and the Z-transforms $V_u(e^{j\omega_{normk}})$ of the interference-signal eigenvectors $\underline{v}_{M-p(v)+1}, \ldots, \underline{v}_M$ at the individual determined, scaled angular frequencies $\omega_{normk}$ of the individual interference-signal spectral lines.

In a subsequent unit 10 for the measurement of power-level curves per determined, scaled angular frequency $\omega_{normk}$, all of the power-level values $P_{MU,v,k}$ of spectral lines, which provide approximately identical scaled angular frequencies $\omega_{normk}$ in different frequency bands v, are combined at the individual FFT bin frequencies $v \cdot f_0$ of the FFT filter bank 1 to form a power-level curve.

The power-level values $\hat{P}_k$ of individual spectral lines, which result from different sinusoidal interference signals with frequencies $f_k$ in different frequency bands v and which are superimposed at an identical scaled angular frequency $\omega_{normk}$ to form a single spectral line, are determined in a unit 11 for determining individual spectral lines from a superimposed spectral line. This superimposition of individual spectral lines, which is based upon the occurrence of subsidiary lines of sinusoidal interference signals because of leakage effects caused by windowing in respectively adjacent frequency bands v and the superposition, accurate with regard to frequency, of main lines of sinusoidal interference signals, is reversed by a deconvolution. For this purpose, a linear equation system with a matrix H comprising the modulus-squared window transmission functions $|H(f-v \cdot f_0)|^2$ frequency-displaced by the respective FFT bin frequency $v \cdot f_0$, the vector $\underline{P}_{MU,v}$ with the power-level values $P_{MU,v,k}$ determined at the respective scaled angular frequency $\omega_{normk}$ in the individual adjacent frequency bands in the units $9_1, 9_2, \ldots, 9_{NFFT}$ for power-level measurement and the vector $\underline{P}$ of the sought power-level values $\hat{P}_k$ of the associated individual spectral lines, is resolved.

After a determination of the frequencies $f_k$ associated with the power-level values $\hat{P}_k$ of the determined spectral lines in the unit 11 for determining individual spectral lines from a superimposed spectral line, the individual, identified spectral lines with their respective power-level values $\hat{P}_k$ and frequencies $f_k$ are entered in respective lists in a unit 14. Alternatively, in unit 14, the power-level values $P_k$ and frequencies $f_k$ of spectral lines in a noise spectrum to be removed can be entered in the respective lists from an external source.

In order to remove the identified or specified spectral lines of sinusoidal interference signals, the eigenvalues $\lambda_1, \ldots, \lambda_M$ determined in the total of $N_{FFT}$ estimation units $5_1, 5_2, \ldots, 5_{NFFT}$ of the autocorrelation matrices $\hat{R}_v$ associated with the respective frequency bands v are supplied to the total of $N_{FFT}$ units $7_1', 7_2', \ldots, 7_{NFFT}'$ for the determination of the noise power $\sigma_{w,v}$ associated with the respective frequency band v. These $N_{FFT}$ units $7_1', 7_2', \ldots, 7_{NFFT}'$ for the determination of the noise power $\sigma_{w,v}$ associated with the respective frequency band v are supplied by a unit 12 for determining the number of sinusoidal interference signals per frequency band v respectively with the number $p(v)$ of sinusoidal interference signals per frequency band v. The unit 12 for determining the number of sinusoidal interference signals per frequency band v evaluates the list prepared in unit 14 with all of the identified or specified spectral lines of sinusoidal interference signals.

The individual units $7_1', 7_2', \ldots, 7_{NFFT}'$ for determining the noise powers $v_{w,v}$ associated with the individual frequency bands v are connected to a unit 13 for generating the noise-power spectrum $\hat{S}(v)$, in which the noise-power spectrum $\hat{S}(v)$ of the entire frequency range to be measured is determined without the undesired spectral lines of the sinusoidal interference signals.

Finally, the unit 15 generates the noise-power spectrum extending over the entire frequency range including the spectral lines of sinusoidal interference signals from noise spectra including the spectral lines of sinusoidal interference signals determined in the units $5_1, 5_2, \ldots, 5_{NFFT}$ for the estimation of the autocorrelation matrix $\hat{R}_v$ for the respective frequency band v. In order to determine the noise-power spectrum in the units $5_1, 5_2, \ldots, 5_{NFFT}$ for the estimation of the autocorrelation matrix $\hat{R}_v$, the dimension M of the respective autocorrelation matrix $\hat{R}_v$ is set to the value 1, so that the noise-power spectrum associated with the respective frequency band v including the spectral lines of sinusoidal interference signals is derived in the sense of equation (12), from the calculation of an autocorrelation matrix $\hat{R}_v$ of this kind.

Figure 15:
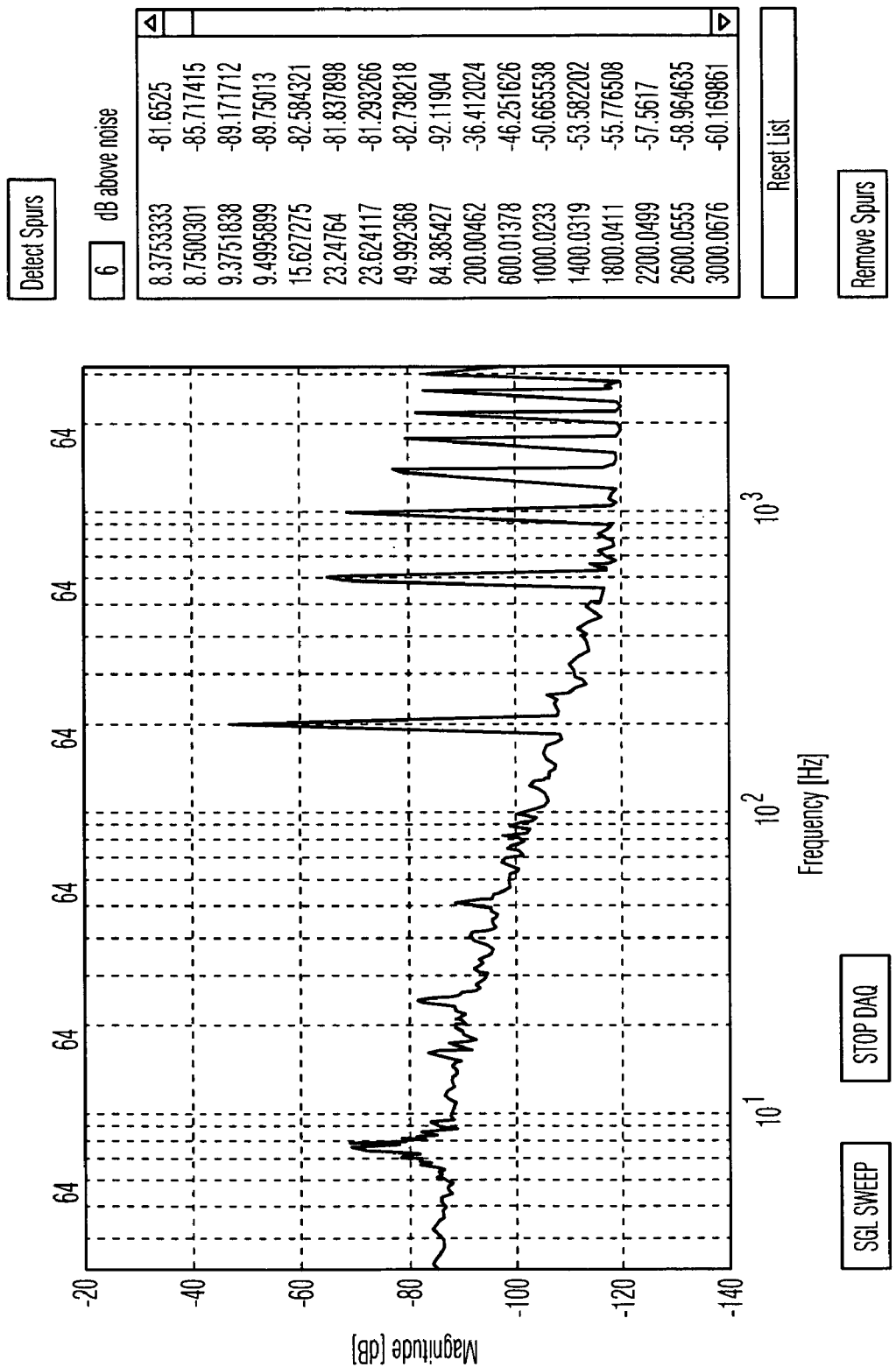
FIG. 15 shows a spectral display of a noise spectrum contaminated with spectral lines of sinusoidal interference signals.

FIG. 15 presents a phase-noise spectrum with superimposed spectral lines of sinusoidal interference signals. The display also contains the frequencies at which spectral lines of sinusoidal interference signals have been identified by the subroutine according to the invention for the identification of sinusoidal interference signals in a noise signal.

Figure 16:
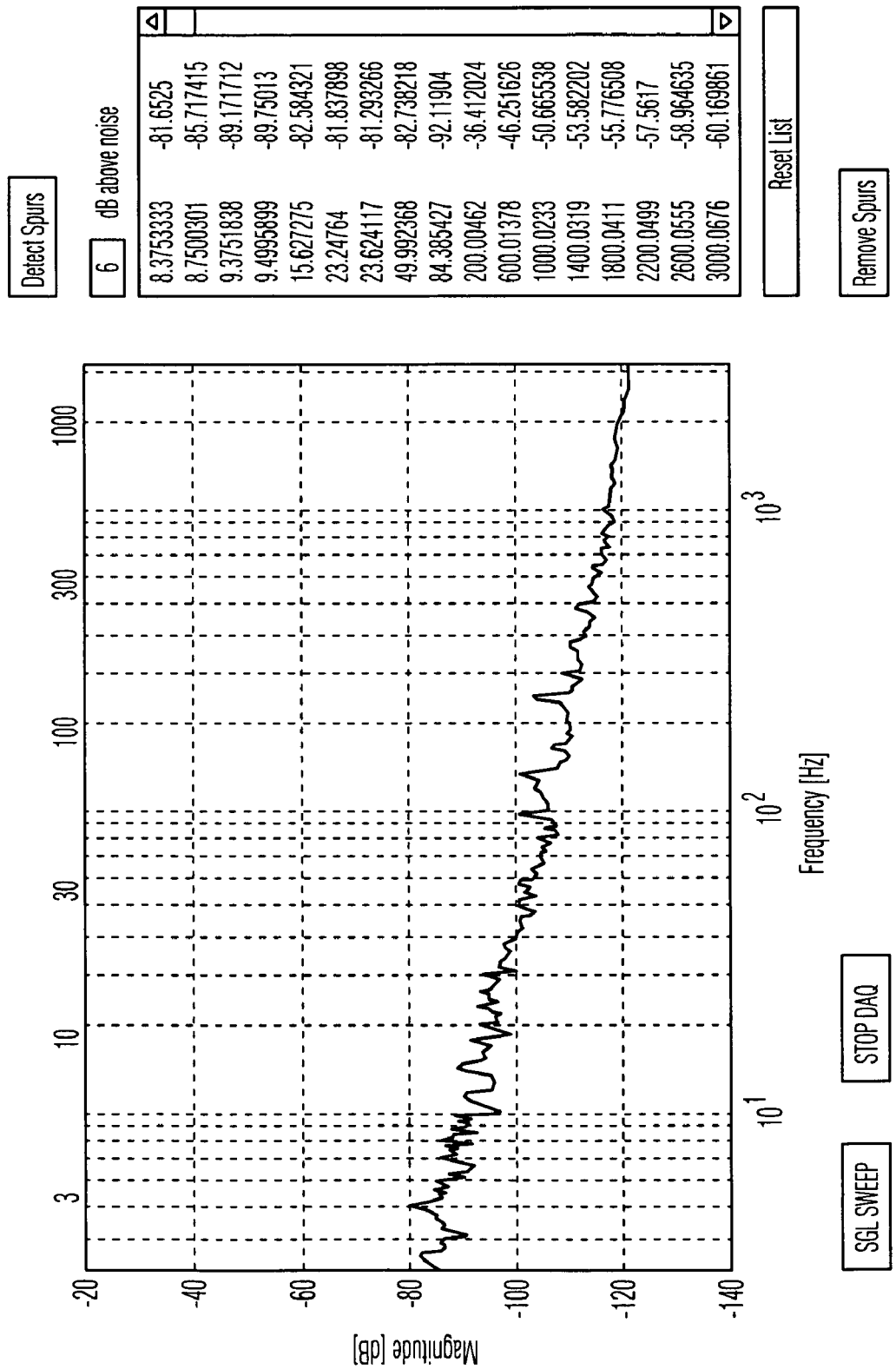
FIG. 16 shows a spectral display of a noise spectrum with spectral lines of sinusoidal interference signals removed.

FIG. 16 shows the identical phase-noise spectrum to that shown in FIG. 15, from which spectral lines associated with sinusoidal interference signals have been removed by the subroutine according to the invention for the removal of sinusoidal interference signals in a noise signal.

The determination of the estimated value $\hat{R}_v$ for the autocorrelation matrix associated with the frequency band v in the case of the method according to the invention for identification is generally completed after a total of $N_{avg}$ averagings, and is implemented continuously in the case of the method according to the invention for the removal of interference-signal spectral lines, wherein the removal of the spectral lines can begin after the provision of a single estimate $\hat{R}_v$ of the autocorrelation matrix associated with the frequency band v, the accuracy of which can be improved with increasing averaging lengths $N_{avg}$ of the estimate $\hat{R}_v$ of the autocorrelation matrix associated with the frequency band v.

The invention is not restricted to the embodiments presented. In particular, instead of the MUSIC method, other frequency estimation methods, which are based upon an eigenvalue analysis of autocorrelation matrices, such as the Pisareko method can also be used.

What is claimed is:

1. A method comprising:
    receiving a noise signal (w(t), w(μ·Δt)) including at least one sinusoidal interference signal ($A_k \cdot e^{j(\omega_k t+\phi_k)}$, $A_k \cdot e^{j(\mu \cdot \omega_k \Delta t+\phi_k)}$);
    splitting a frequency range of the noise signal (w(t), w(μ·Δt)) into a plurality of frequency bands (v) via a Fast Fourier Transform (FFT) filter bank;
    determining, for each of the frequency bands (v), an autocorrelation matrix ($\hat{R}_v$), wherein parameters of the autocorrelation matrices ($\hat{R}_v$) are variably adjusted based on whether the at least one sinusoidal interference signal ($A_k \cdot e^{j(\omega_k t+\phi_k)}$, $A_k \cdot e^{j(\mu \cdot \omega_k \Delta t+\phi_k)}$) is to be measured, identified, and/or removed and further based on at least one averaging; and
    utilizing, jointly, the autocorrelation matrices ($\hat{R}_v$) for one or more of measuring, identifying, or removing the at least one sinusoidal interference signal ($A_k \cdot e^{j(\omega_k t+\phi_k)}$, $A_k \cdot e^{j(\mu \cdot \omega_k \Delta t+\phi_k)}$) in the noise signal (w(t), w(μ·Δt)).

2. A method according to claim 1, wherein the parameters of a particular autocorrelation matrix ($\hat{R}_v$) relate to a number of averagings ($N_{avg}$) and a matrix dimension (M) of the particular autocorrelation matrix ($\hat{R}_v$).

3. A method according to claim 2, wherein the variable adjustment of the parameters of the particular autocorrelation matrix ($\hat{R}_v$) occurs subsequently to an initial determination of the particular autocorrelation matrix ($\hat{R}_v$).

4. A method according to claim 2, wherein the matrix dimension (M) of the respective autocorrelation matrices ($\hat{R}_v$) is equal to the value 1, if only measuring the at least one sinusoidal interference signal ($A_k \cdot e^{j(\omega_k t+\phi_k)}$, $A_k \cdot e^{j(\mu \cdot \omega_k \Delta t+\phi_k)}$) is to be implemented.

5. A method according to claim 2, wherein the matrix dimension (M) of the respective autocorrelation matrices ($\hat{R}_v$) is at least equivalent to a maximum expected number ($P_{max}$) of one or more sinusoidal interference signals ($A_k \cdot e^{j(\omega_k t+\phi_k)}$, $A_k \cdot e^{j(\mu \cdot \omega_k \Delta t+\phi_k)}$) in the respective frequency bands (v) with an addition of the value 2, if only measuring and identifying the at least one sinusoidal interference signal ($A_k \cdot e^{j(\omega_k t+\phi_k)}$, $A_k \cdot e^{j(\mu \cdot \omega_k \Delta t+\phi_k)}$) are to be implemented.

6. A method according to claim 2, wherein the matrix dimension (M) of the respective autocorrelation matrices ($\hat{R}_v$) is at least equivalent to an identified number ($P_{max}$) of one or more sinusoidal interference signals ($A_k \cdot e^{j(\omega_k t+\phi_k)}$, $A_k \cdot e^{j(\mu \cdot \omega_k \Delta t+\phi_k)}$) in the frequency bands (v) with an addition of the value 1, if only measuring and removing the at least one sinusoidal interference signal ($A_k \cdot e^{j(\omega_k t+\phi_k)}$, $A_k \cdot e^{j(\mu \cdot \omega_k \Delta t+\phi_k)}$) are to be implemented.

7. A method according to claim 2, wherein the matrix dimension (M) of the respective autocorrelation matrices ($\hat{R}_v$) is at least equivalent to a maximum expected number ($P_{max}$) of one or more sinusoidal interference signals ($A_k \cdot e^{j(\omega_k t+\phi_k)}$, $A_k \cdot e^{j(\mu \cdot \omega_k \Delta t+\phi_k)}$) in the respective frequency bands (v) with an addition of the value 2, if measuring, identifying, and removing the at least one sinusoidal interference signal ($A_k \cdot e^{j(\omega_k t+\phi_k)}$, $A_k \cdot e^{j(\mu \cdot \omega_k \Delta t+\phi_k)}$) are to be implemented at a same time.

8. A method according to claim 2, wherein increasing the number of averagings ($N_{avg}$) improves measuring, identifying, and removing the at least one sinusoidal interference signal ($A_k \cdot e^{j(\omega_k t+\phi_k)}$, $A_k \cdot e^{j(\mu \cdot \omega_k \Delta t+\phi_k)}$).

9. A system comprising:
    one or more units, the one or more units configured to cause the system at least to:
    receive a noise signal (w(t), w(μ·Δt)) including at least one sinusoidal interference signal ($A_k \cdot e^{j(\omega_k t+\phi_k)}$, $A_k \cdot e^{j(\mu \cdot \omega_k \Delta t+\phi_k)}$),
    split a frequency range of the noise signal (w(t), w(μ·Δt)) into a plurality of frequency bands (v) via one or more Fast Fourier Transformations,
    determine, for each of the frequency bands (v), an autocorrelation matrix ($\hat{R}_v$), wherein parameters of the autocorrelation matrices ($\hat{R}_v$) are variably adjusted based on whether the at least one sinusoidal interference signal ($A_k \cdot e^{j(\omega_k t+\phi_k)}$, $A_k \cdot e^{j(\mu \cdot \omega_k \Delta t+\phi_k)}$) is to be measured, identified, and/or removed and further based on at least one averaging, and
    utilize, jointly, the autocorrelation matrices ($\hat{R}_v$) for one or more of measuring, identifying, or removing the at least one sinusoidal interference signal ($A_k \cdot e^{j(\omega_k t+\phi_k)}$, $A_k \cdot e^{j(\mu \cdot \omega_k \Delta t+\phi_k)}$) in the noise signal (w(t), w(μ·Δt)).

10. A system according to claim 9, wherein the parameters of a particular autocorrelation matrix ($\hat{R}_v$) relate to a number of averagings ($N_{avg}$) and a matrix dimension (M) of the particular autocorrelation matrix ($\hat{R}_v$).

\* \* \* \* \*